United States Patent [19]
Nagaishi et al.

[11] Patent Number: 5,624,722
[45] Date of Patent: Apr. 29, 1997

[54] APPARATUS AND METHOD FOR DEPOSITING FILMS ON SUBSTRATE VIA ON-AXIS LASER ABLATION

[75] Inventors: Tatsuoki Nagaishi; Hideo Itozaki, both of Itami, Japan

[73] Assignee: Sumitomo Electric Industries, Ltd., Osaka, Japan

[21] Appl. No.: 609,248

[22] Filed: Mar. 1, 1996

[30] Foreign Application Priority Data

Mar. 7, 1995 [JP] Japan .................................. 7-074424
Mar. 7, 1995 [JP] Japan .................................. 7-074445
Mar. 7, 1995 [JP] Japan .................................. 7-074608

[51] Int. Cl.$^6$ .................................................. C23C 8/00
[52] U.S. Cl. .................... 427/586; 118/50.1; 118/696; 118/729; 118/730; 118/500; 427/209; 427/248.1; 427/255.5; 427/294; 427/314; 427/596
[58] Field of Search .................... 427/586, 596, 427/294, 314, 209, 248.1, 255.5; 118/696, 729, 730, 50.1, 500

[56] References Cited

FOREIGN PATENT DOCUMENTS 4210613  10/1993  Germany.

OTHER PUBLICATIONS

Yoshitake et al., "Fabrication of low–loss microstrip band–pass filter made from double-sided $YBA_2Cu_3O_x$ films", Japanese Journal Of Applied Physics, Part 2, 15 Aug. 1994, Japan, vol. 33, No. 88, pp. L1156–L1158.

Fukutomi et al., "Deposition of in–plane aligned $YBa_2Cu_3O_y$,$Y_2O_3$ stabilized $ZrO_2$ thin film on both sides of metallic tape substrates", Physica C, 20 Sep. 1994, Netherlands, vol. 231, No. 1–2, pp. 113–117.

R. Pinto, "Power and Temperature Dependence of Q Factor of a Double Sided Thin Film $YBa_2Cu_3O_{7-\delta}$ Microstrip Resonator", Applied Superconductivity, 1 Jan. 1993, vol. 1, No. 1, pp. 1–6.

B. Holzapfel, "Off–axis laser deposition of $YBa_2Cu_3O_{7-\delta}$ thin films", Applied Physics Letters, 28 Dec. 1992, vol. 61, No. 26, pp. 3178–3180.

*Primary Examiner*—Bernard Pianalto
*Attorney, Agent, or Firm*—Beveridge, DeGrandi, Weilacher & Young, LLP

[57] ABSTRACT

An apparatus and a method are provided for depositing both surfaces of the substrate in one deposition process via on-axis oriented laser ablation. For example, the first apparatus for depositing thin films according to the present invention comprises (1) a vacuum chamber, said chamber having (a) a first target supported by a first target holder, (b) a second target supported by a second target holder so as to face the first target, (c) a substrate holder for holding a substrate such that first and second surfaces of the substrate face the first and second targets, respectively, (d) a heating means for heating the substrate, (e) a first entrance window through which a first laser beam passes and strikes on the first target with a predetermined angle, and (f) a second entrance window through which a second laser beam passes and strikes on the second target with a predetermined angle and (2) a laser optical system comprising at least one laser beam source and optical path system including mirror for reflecting the laser beam from the laser beam source into the first and second targets respectively with the predetermined angles through the first and second entrance windows of the chamber.

23 Claims, 10 Drawing Sheets

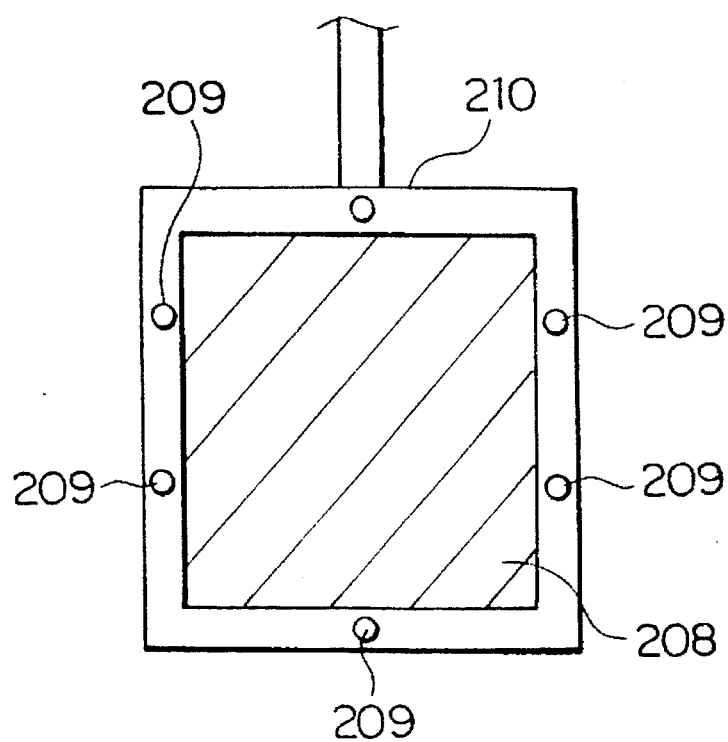
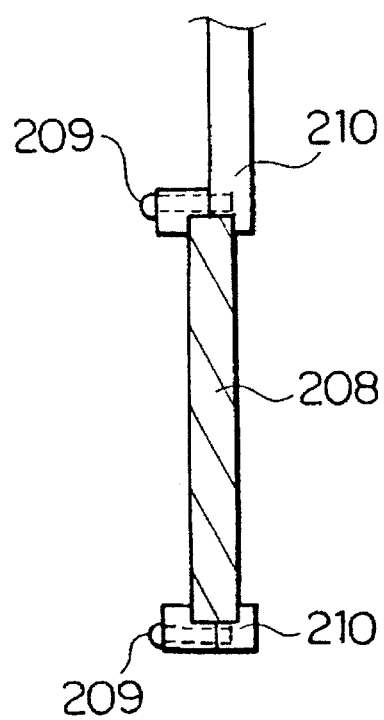
Fig.10A
Fig.10B

1

APPARATUS AND METHOD FOR DEPOSITING FILMS ON SUBSTRATE VIA ON-AXIS LASER ABLATION

BACKGROUND OF THE INVENTION

1. Field of the Invention

The present invention relates to a deposition process via laser ablation. More particularly, the present invention is suitable for forming electronic and microwave devices comprising oxide compounds.

2. Related Background Art

Laser ablation is one of the most suitable deposition process for producing excellent quality of thin films on substrate or workpiece. Laser ablation process has advantages, such as excellent stoichiometric stability of deposited film, when the process is used for depositing films of complex metal oxide compounds such as $Y_1Ba_2Cu_3O_{7-x}$. There is another advantage in Laser ablation processing that it requires no electromagnetic fields which may possibly affect the charged particle contained in the deposited film. Therefore, laser ablation is expected to be employed as deposition process for the most promising nearterm devices.

Higaki et al (Institute of Electronics, Information and Communication Engineers, advanced conference paper, Apr. 26, 1991, hereinafter called "Reference 1") describes that a planar-type disk resonator formed when a thin layer of $Y_1Ba_2Cu_3O_{7-x}$ (referred to as "YBCO") is deposited by sputtering has excellent characteristics for the use in the microwave/millimeter-wave fields, such as temperature dependence of the surface resistance.

As described in the Reference 1, qualities of a thin film of oxides, such as crystallinity, are particularly important for microwave devices.

FIG. 9 shows an exploded perspective view of a resonator disclosed in the Reference 1. As shown in FIG. 9, a resonator 100 in accordance with Reference 1 has a configuration, in which a center dielectric layer 108 having a circular thin film 106 and rectangular thin films 107a and 107b thereon is sandwitched between an underlying lower dielectric layer 104 having a lower ground plane 102 of a gold thin film on its surface and an overlying upper dielectric layer 112 having an upper ground plane 110 of a gold thin film, by adhesion of these dielectric layers.

However, since the center dielectric layer is adhered to both the upper and the lower dielectric layer to form the device, high-frequency characteristics of the device may be affected with the adhesion conditions.

Holzapfel et.al. describes that c-axis oriented epitaxial thin films of $YBa_2Cu_3O_{7-x}$ had been formed on both the front and the back surfaces of a substrate having (100) plane of $LaAlO_3$ and $SrTiO_3$ by the laser ablation of off-axis arrangement [Holzapfel, B. et al., Applied Physics Letters, 61(26), pp. 3178–3180, 28 December 1992, hereinafter called "Reference 2"]. The disclosure of the Holzapfel et.al. is hereby incorporated by reference.

The Reference 2 suggests a possibility of forming thin films of oxides on both upper and lower surfaces of a dielectric substrate, thereby forming ground planes onto the dielectric substrate to produce resonator. However, Reference 2 does not describe any useful method for forming acceptable films for superior electronic or microwave devices on both the front and the back surfaces in one process.

Therefore, it is desirable to provide a method for forming more reliable member used for microwave devices by employing laser ablation.

SUMMARY OF THE INVENTION

The first apparatus for depositing thin films according to the present invention comprises (1) a vacuum chamber which is thermally resistant at temperature of 200° C., said chamber having (a) a first target of a first deposition material supported by a first target holder, (b) a second target of a second deposition material supported by a second target holder so as to face the first target, (c) a substrate holder for holding a substrate such that first and second surfaces of the substrate respectively face the first and second targets, (d) a heating means for heating the first and second surfaces of the substrate, (e) a first entrance window through which a first laser beam passes and strikes on the first target with a predetermined angle, and (f) a second entrance window through which a second laser beam passes and strikes on the second target with a predetermined angle and (2) a laser optical system comprising at least one laser beam source and optical path system including mirror for reflecting the laser beam from the laser beam source into the first and second targets respectively with the predetermined angles through the first and second entrance windows of the chamber.

The first method for depositing thin films according to the present invention includes steps of (a) disposing a first target and a second target so as to face each other within a chamber; (b) disposing a substrate between the first and second targets such that first and second surfaces of the substrate face the first and second targets, respectively; (c) heating the substrate with a heating means disposed within the chamber so as to maintain the substrate at a predetermined temperature; and (d) directing the first and second laser beams to the first and second targets, respectively, to form a first plume over the first target and a second plume over the second target, the axis of the first plume being substantially perpendicular to the first surface of the substrate and the axis of the second plume being substantially perpendicular to the second surface of the substrate, wherein said first plume contacts the first surface and the second plume contacts the second surface, thereby depositing the first deposition material on the first surface, and depositing the second deposition material on the second surface.

The second apparatus for depositing thin films according to the present invention comprises (1) a vacuum chamber which is thermally resistant at temperature of 1,000° C., said chamber having (a) a first target of a first deposition material supported by a first target holder, (b) a second target of a second deposition material supported by a second target holder so as to face the first target, (c) a substrate holder for holding a substrate such that first and second surfaces of the substrate respectively face the first and second targets, (d) a chamber wall having a substantially transparent portion, (e) a first entrance window through which a first laser beam passes and strikes on the first target with a predetermined angle, and (f) a second entrance window through which a second laser beam passes and strikes on the second target with a predetermined angle, (2) a heating means of outside the chamber for heating the first and second surfaces of the substrate contained in the chamber through the substantially transparent portion of the chamber wall, and (3) a laser optical system comprising at least one laser beam source and optical path system including mirror for reflecting the laser beam from the laser beam source into the first and second targets respectively with the predetermined angles through the first and second entrance windows of the chamber.

The second method for depositing thin films according to the present invention includes steps of (a) disposing a first target and a second target so as to face each other within a chamber; (b) disposing a substrate between the first and second targets such that first and second surfaces of the substrate face the first and second targets, respectively; (c) heating the substrate with a heating means disposed outside the chamber so as to maintain the substrate at a predetermined temperature; and (d) directing the first and second laser beams to the first and second targets, respectively, to form a first plume over the first target and a second plume over the second target, the axis of the first plume being substantially perpendicular to the first surface of the substrate and the axis of the second plume being substantially perpendicular to the second surface of the substrate, wherein said first plume contacts the first surface and the second plume contacts the second surface, thereby depositing the first deposition material on the first surface, and depositing the second deposition material on the second surface.

The third apparatus for depositing thin films according to the present invention comprises (1) a vacuum chamber which is thermally resistant at temperature of 200° C., the chamber having (a) a target which comprises a deposition material and is supported by a target holder, (b) a substrate holder for holding a substrate such that either of the surfaces of the substrate faces the target, (c) a reversing means for intermittently reversing the substrate with a predetermined period, (d) a heating means for heating the substrate, and (e) an entrance window through which a laser passes and strikes on the target with a predetermined angle, and (2) a laser optical system comprising a laser beam source and optical path system including mirror for reflecting the laser beam from the laser beam source into the target with the predetermined angle through the entrance window of the chamber.

The third method for depositing thin films according to the present invention comprises steps of (a) disposing a target within a chamber; (b) disposing a substrate near the target such that either of the surfaces faces the target; (c) heating the substrate by a heating means; and (d) directing the laser beam to the target to form plume over the target, the axis of the plume being substantially perpendicular to the surface of the substrate, while reversing the substrate with a predetermined period, thus depositing the target material on the first and second surfaces of the substrate.

According to the first and the second apparatus of present invention, one target is disposed near the front surface (first surface or upper surface) of the substrate and another target is disposed near the back surface (second surface or lower surface) of a substrate. Each of these targets has their own laser beam path into the target. In these arrangement, different laser beam impinges onto each of the targets, and different laser-induced plume is created over each of the targets, thereby each of surfaces of the substrate contacts different plume.

Therefore, thin films with the excellent quality and the uniform thickness distribution can be simultaneously formed on both sides of the substrate in one deposition process. Further, since respective targets and laser beams are used for these surfaces, the deposition rates on the front and the back surfaces can be separately controlled, while it is also possible for the thin films to be formed on both surfaces with the same deposition rate.

On the other hand, although the third apparatus of the present invention has only one target holder for one substrate, the third apparatus has a reversing means for intermittently reversing the substrate with a predetermined period. Therefore, each of surfaces of the substrate contacts the plume for predetermined periods, to deposit films on both side of the substrate with the excellent quality and the uniform thickness distribution in one deposition process.

Consequently, layers of a conductor or high-temperature superconductor can be formed on both surfaces of a single substrate in one process without any adhesion process, thereby high-frequency devices can be produced with favorable high-frequency characteristics and improved reliability.

BRIEF DESCRIPTION OF THE DRAWINGS

These and other features, aspects, and advantages of the present invention will become better understood with reference to the following description, appended claims, and accompanying drawings, where;

FIGS. 10A and 10B are respectively front and side views showing a substrate holder used in an embodiment of the present invention.

DETAILED DESCRIPTION OF THE PREFERRED EMBODIMENTS

The First Laser Ablation Apparatus

Figure 3:
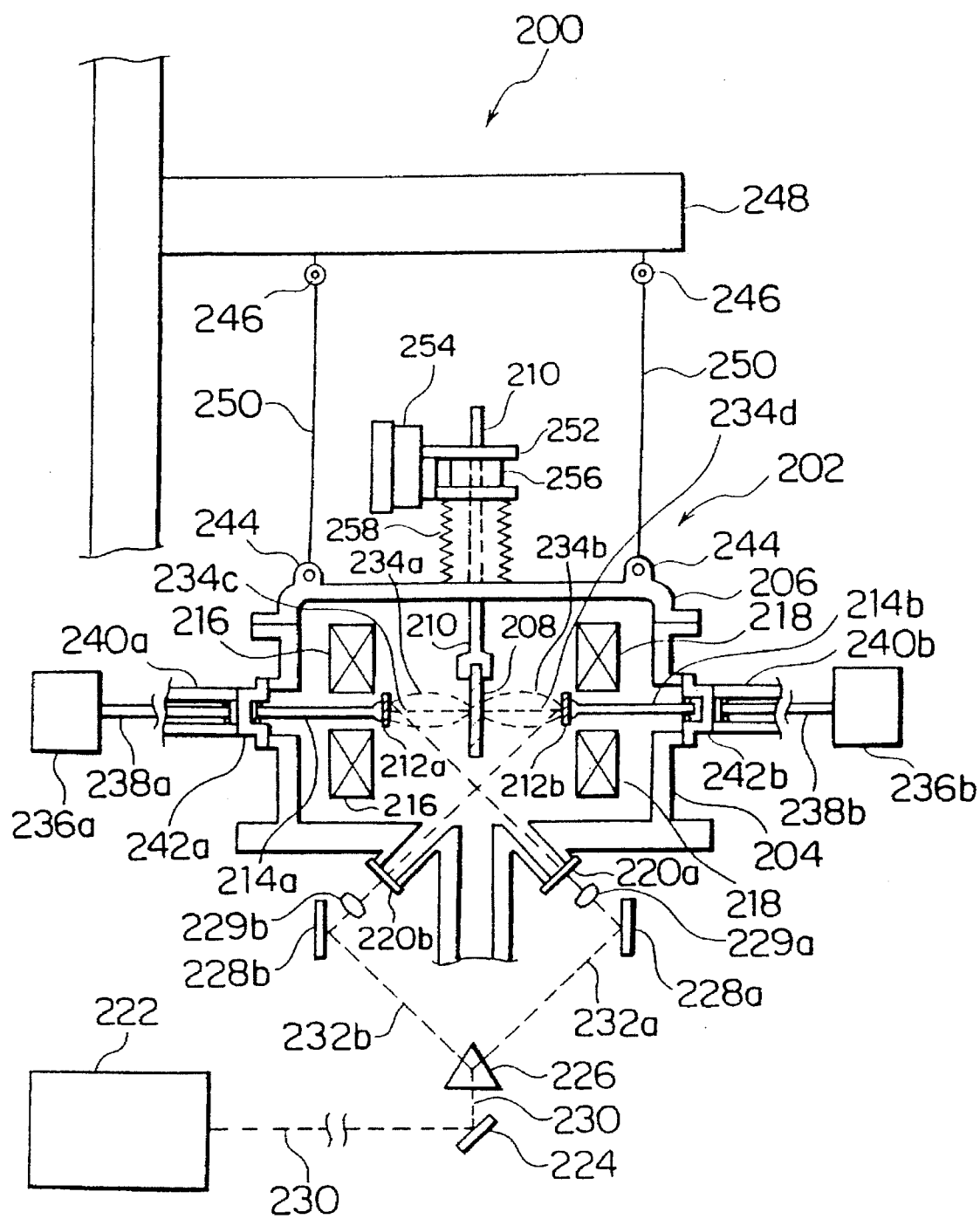
FIG. 3 is a cross-sectional view showing a first laser ablation apparatus which is preferably used for performing a manufacturing method in accordance with the present invention.
Figure 4:
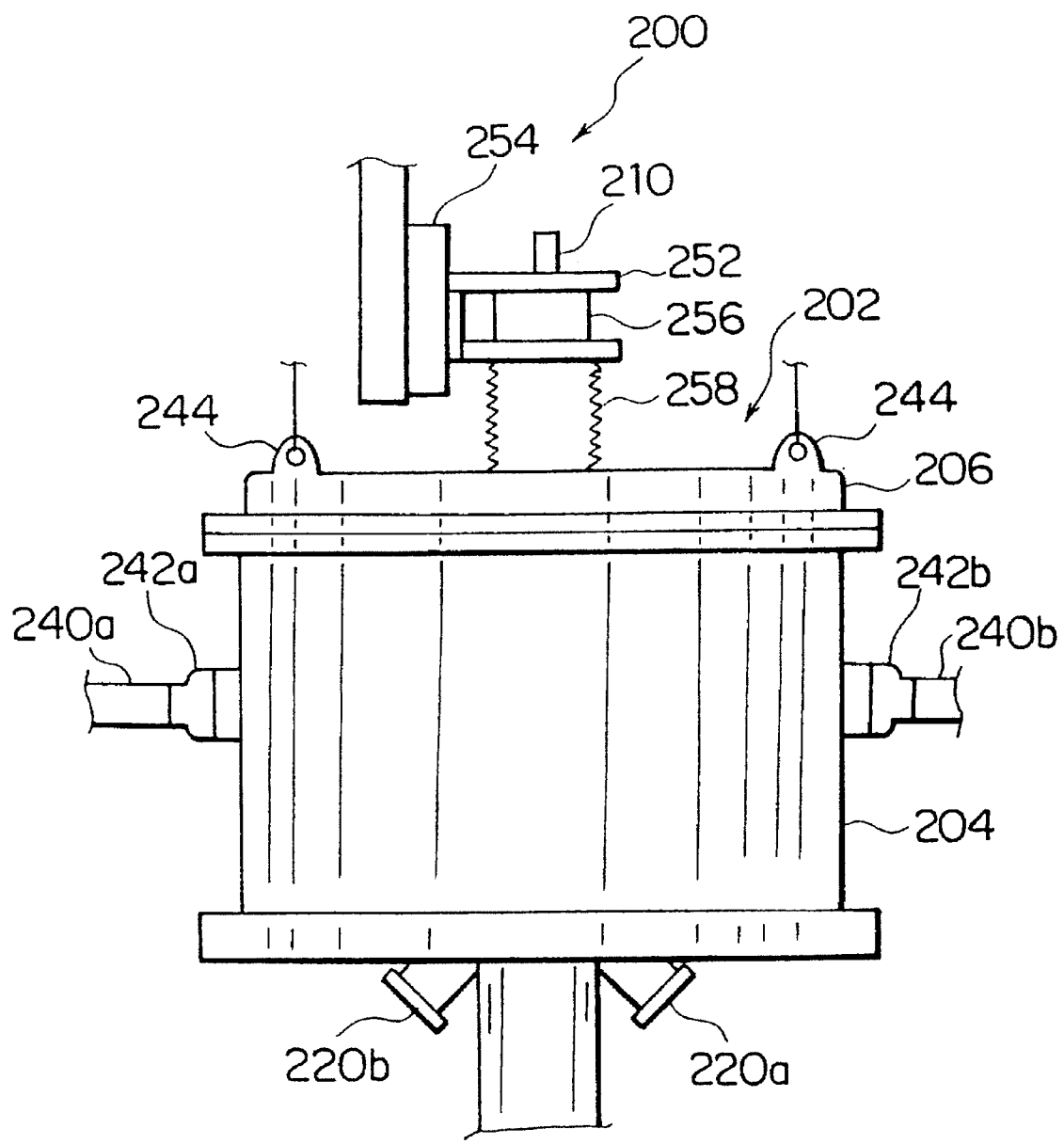
FIG. 4 is an exterior view showing the first laser ablation apparatus shown in FIG. 3.

FIG. 3 is a cross-sectional view showing the first laser ablation apparatus according to the present invention, and FIG. 4 is an exterior view showing the chamber of this laser ablation apparatus. In the following, the laser ablation apparatus used in Examples will be explained with reference to FIGS. 3 and 4.

As shown in FIGS. 3 and 4, a laser ablation apparatus 200 of the first embodiment according to the present invention comprises a bell jar type processing chamber 202 for laser ablation. The chamber 202 is evacuable and defined by a body 204 made of "SUS 304" stainless steel and a lid 206 made of "SUS 304". The chamber 202 includes a substrate holder 210 for holding a substrate 208 as well as target holders 214a and 214b for respectively holding targets 212a and 212b of a target material such as metal oxide complex.

The target material of the first target 212a may be different from the target material of the second target 212b, if desired.

FIGS. 10A and 10B are front and side views showing the substrate holder of this embodiment, respectively. As Shown in these drawings, the substrate holder 210 comprises a frame having a groove with an appropriate size to fit the substrate 208, thereby the substrate 208 is held at its end by means of screws 209.

In the laser ablation apparatus of the first embodiment, the two target holders 214a and 214b are provided for one substrate holder 210. The front and the back surfaces of the substrate 208 face the targets 212a and 212b, respectively, as shown in FIG. 3. The distance between the substrate 208 and each of the targets 212a and 212b is about 5 to about 10 cm.

As shown in FIGS. 3 and 4, a pair of doughnut-shaped heaters 216 and 218 are included within the chamber 202. The "left" heater 216 is disposed, substantially in parallel to the "right" heater 218, and across the substrate 208 from the heater 218, so as to uniformly heat the substrate 208 such that the substrate surfaces have uniform temperature distributions. The target holders 214a and 214b extend through the center of the doughnut heaters 216 and 218, respectively, to the vicinities of the substrate 208, as shown in FIG. 3.

The heater 216 and 218 are capable of being controlled so as to adjust the output power to the desired level for the increasing substrate temperature during the deposition due to the change of the optical, absorption index of the substrate.

Other arrangements of the heaters are also available. For example, the chamber may include upper doughnut-shaped heater and the lower doughnut-shaped heater, and the target holders may extend through the region between the upper and the lower heaters.

Next, the laser optical system of the laser ablation apparatus 200 will be explained. The laser ablation apparatus 200 has a laser beam optical system disposed outside of the chamber. As shown in FIGS. 3 and 4, the chamber 202 has entrance windows 220a and 220b through which laser beam passes and enter into the chamber 202. The laser beam optical system comprises a laser source 222, a mirror 224, a prism 226, a mirror 228a and a condenser lens 229a for the entrance window 220a, and a mirror 228b and a condenser lens 229b for the entrance window 220b. Both of the entrance windows 220a and 220b are made of synthetic quartz having a thickness of 10 mm. The laser beam source 222 is a KrF excimer laser source for emitting a laser beam having a wavelength of 248 nm. Alternatively, the laser source may be of ArF excimer laser having a wavelength of 193 am or of XeCl excimer laser having a wavelength of 308

The laser beam (indicated by the dotted line 230) from the laser beam source 222 enters into the prism 226 by way of the mirror 224, where the laser beam splits into two beams (indicated by the dotted lines 232a and 232b). Then the respective laser beam passes mirrors 228a and 228b and the condenser lenses 229a and 229b,and then enters the entrance windows 220a and 220b, respectively.

The type of the laser beam system available to the present invention is not limited to the illustrated embodiment shown in FIG. 3. For example, two laser sources may be provided for the two targets. In this manner, deposition rates at the front and the back surfaces of the substrate can separately be controlled, by adjusting each of the laser beam energies of the two laser beam source, respectively.

During striking of the laser beam onto the target surfaces, atoms of metal oxide on the surfaces of targets 212a and 212b are activated and sublimed to form laser-induced plumes (schematically depicted with dotted curves 234a and 234b), whereby the atoms of the target material are released and reach the substrate 208, thereby being deposited on the substrate surfaces. The plumes 234a and 234b are respectively formed with axes 234c and 234d.

Here, the substrate in this embodiment is on-axis oriented. More specifically, the substrate 208 is disposed, so as to be substantially perpendicular to the axis of the plumes 234c and 234d, or in other word, the surfaces of substrate 208 is positioned so as to form an angle of about 60° (deg.) to 120° (deg.) with respect to the axes 234c and 234d of the plumes. Since a plume is formed with an axis perpendicular to a target surface, the deposition surface of the substrate is disposed so as to have an angle of about −30° to about +30° with respect to the target surface.

Since the mirrors 228a and 228b for reflecting laser beams are fixed, the laser beam path are also affixed to reach onto predetermined locations of the targets 212a and 212b, thereby cause non-uniform consumption of the targets. In order to avoid the non-uniform consumption of the targets, the targets are rotated such that the laser can be incident on a certain range of area.

As shown in FIGS. 3 and 4, a target-rotating mechanism in the laser ablation apparatus 200 comprises motors 236a and 236b, shafts 238a and 238b, tubes 240a and 240b for holding the shafts, and coupling portions 242a and 242b. An end portion of each of the shafts 238a and 238b on the chamber side and an end portion of each of the target holders 214a and 214b on the chamber wall side are respectively equipped with magnets (not shown), whereby rotational movements of the shafts 238a and 238b provided by the motors 236a and 236b are transmitted to the target holders 214a and 214b by magnetic connection, respectively. The targets 212a and 212b are rotated by means of such terminals for introducing magnetic coupling rotation.

The chamber 202 for forming films on both sides of a dielectric substrate by laser ablation is supported by a supporting member 248. As shown in FIGS. 3 and 4, the chamber 202 is suspended from a supporting member 248 by means of a wire 250 between a tab 244 provided with the chamber 202 and a ring 246 attached to the supporting member 248.

Also, in order to achieve uniform deposition of films on the substrate, the laser ablation apparatus comprises a mechanism for reciprocating the substrate along two axes in predetermined axial directions of horizontal and vertical directions.

As shown in FIGS. 3 and 4, the upper portion of the chamber 202 comprises a holding plate 252 for holding the substrate holder 210 while maintaining the sealing properties of the chamber, a vertical axial motor 254 which is connected to the holding plate 252 so as to move the latter in the vertical axial direction, and a horizontal axial motor 256 which moves the holding plate 252 in the horizontal axial direction. In addition, a bellows 258 for freely moving the substrate holder 210 in the vertical and horizontal axial directions is provided on the top surface of the lid 206.

The Second Laser Ablation Apparatus

Figure 5:
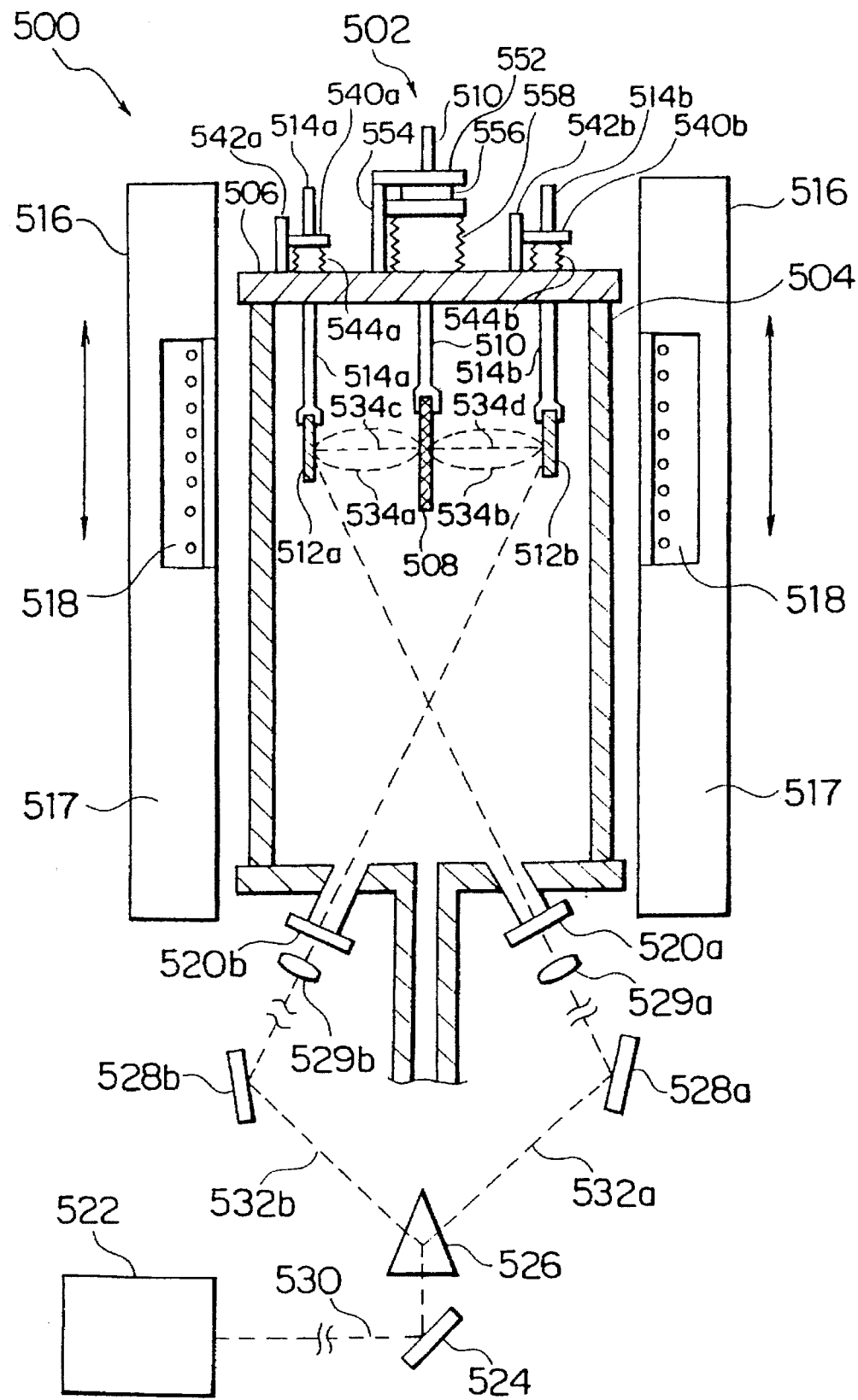
FIG. 5 is a cross-sectional view showing a second laser ablation apparatus which is preferably used for performing a manufacturing method in accordance with the present invention.

As shown in FIG. 5, a laser ablation apparatus 500 of the second embodiment according to the present invention comprises a laser ablation processing chamber 502 having a cylindrical shape. The chamber 502 is evacuable and is defined by a body 504 made of quartz and a lid 506 made of a metal such as SUS 304. The chamber 502 contains a substrate holder 510 for holding a substrate 508 as well as target holders 514a and 514b for respectively holding targets 512a and 512b made of a target material such as metal oxide. The target material of the first target 512a may be different from the target material of the second target 512b, if desired.

The substrate holder 510 comprises a frame having a groove which has an appropriate size to fit the substrate 508, whereby the substrate is held at its end by means of screws, in the similar manner as shown in FIGS. 10A and 10B.

In the laser ablation apparatus 500 of the second embodiment, the two target holders 514a and 514b are provided for one substrate holder 510. The front and the back surfaces of the substrate 508 face the two targets 512a and 512b, respectively. The distance between the substrate 508 and each of the targets 512a and 512b is about 5 to about 10 cm.

As shown in FIG. 5, a cylindrical heater assembly 516 is positioned to surround the chamber 502. The circumferential heater assembly 516 comprises a insulating portion 517 made of a thermal insulator and a heater 518. In this embodiment, the heater 518 is a gold-image furnace type heater. The heater 518 efficiently radiates to and heats the substrate 508 and the two targets 512a and 512b through the quartz chamber body or wall 504. Also, a mechanism (not shown) is attached to the heater assembly 516 which can upwardly or downwardly carry the heater assembly 516 (as indicated by arrows in FIG. 5), thereby heater assembly 516 can rapidly be removed away from the chamber to assist the rapid cooling of the chamber.

The heater assembly 516 is capable of being controlled so as to adjust the output power to the desired level for the increasing substrate temperature during the deposition due to the change of the optical absorption index of the substrate.

Next, the laser optical system of the laser ablation apparatus 500 will be explained. In this apparatus 500, a laser beam source 522 is disposed outside of the chamber. As shown in FIG. 5, the chamber 502 has entrance windows 520a and 520b through which laser beams can enter the chamber 502. The laser optical system of the present embodiment comprises a laser beam source 522, a mirror 524, a prism 526, a mirror 528a and a condenser lens 529a for the entrance window 520a, and a mirror 528b and a condenser lens 529b for the entrance window 520b. Both of the entrance windows 520a and 520b are made of synthetic quartz having a thickness of 10 mm. The laser beam source 522 comprises a KrF excimer laser source for emitting a laser having a wavelength of 248 nm. Alternatively, this laser source may be of ArF excimer laser having a wavelength of 193 nm or of XeCl excimer laser having a wavelength of 308 nm.

The laser from the laser beam source 522 (indicated by dotted line 530) enters the prism 526 by way of the mirror 524, where the laser beam splits into two beams (indicated by dotted lines 532a and 532b). Then the respective beam passes the mirrors 528a and 528b and the condenser lenses 529a and 529b, and then enters the entrance windows 520a and 520b, respectively.

As mentioned in the first embodiment, the available laser system for the second embodiment is not limited to the system shown in FIG. 5.

Respective plume is formed over the surface of each of the target, as indicated by 534a and 534b in FIG. 5.

Here, as mentioned in the first embodiment, the substrate in this embodiment is also on-axis oriented. More specifically, the substrate 508 is disposed, so as to be substantially perpendicular to the axis of the plumes 534c and 534d, or in other word, the surfaces of substrate 508 is positioned so as to form an angle of about 60° (deg.) to 120° (deg.) with respect to the axes 534c and 534d of the plumes. Since a plume is formed with an axis perpendicular to a target surface, the deposition surface of substrate is disposed so as to have an angle of about −30° to about +30° with respect to the target surface.

In this embodiment, since the mirrors 528a and 528b for the directions of laser beam are fixed, the laser beam path are also affixed to reach onto predetermined locations of the targets 512a and 512b, thereby cause non-uniform consumption of the target. In order to prevent the non-uniform consumption of the target, the targets are capable of vertically moving such that the laser beam can enter onto a certain range of area.

As shown in FIG. 5, a target-moving mechanism in the laser ablation apparatus 500 comprises holding plates 540a and 540b, which respectively hold the target holders 514a and 514b while sealing of the chamber maintains, and vertical axial motors 542a and 542b, which are connected to the holding plates so as to move them in the vertical axial direction. Also, bellows 544a and 544b for freely moving the target holders in the vertical axial direction, are provided on the top surface of the lid 506.

Also, in order to uniformly deposit the target material on the substrate, the laser ablation apparatus is provided with a mechanism for reciprocating the substrate along two axes in predetermined axial directions of horizontal and vertical directions.

As shown in FIG. 5, the chamber 502 comprises a holding plate 552 for holding the substrate holder 510 while maintaining its airtightness, a vertical axial motor 554 which is connected to the holding plate 552 so as to move the latter in the vertical axial direction, and a horizontal axial motor 556 which moves the holding plate 552 in the horizontal axial direction. Further, a bellows 558 for freely moving the substrate holder 510 in the vertical and horizontal axial directions is provided on the top surface of the lid 506.

Here, target-moving mechanism may include a horizontal-axial motor for moving the target holder along two axes, just like as in the substrate-moving mechanism.

The Third Laser Ablation Apparatus

Figure 6:
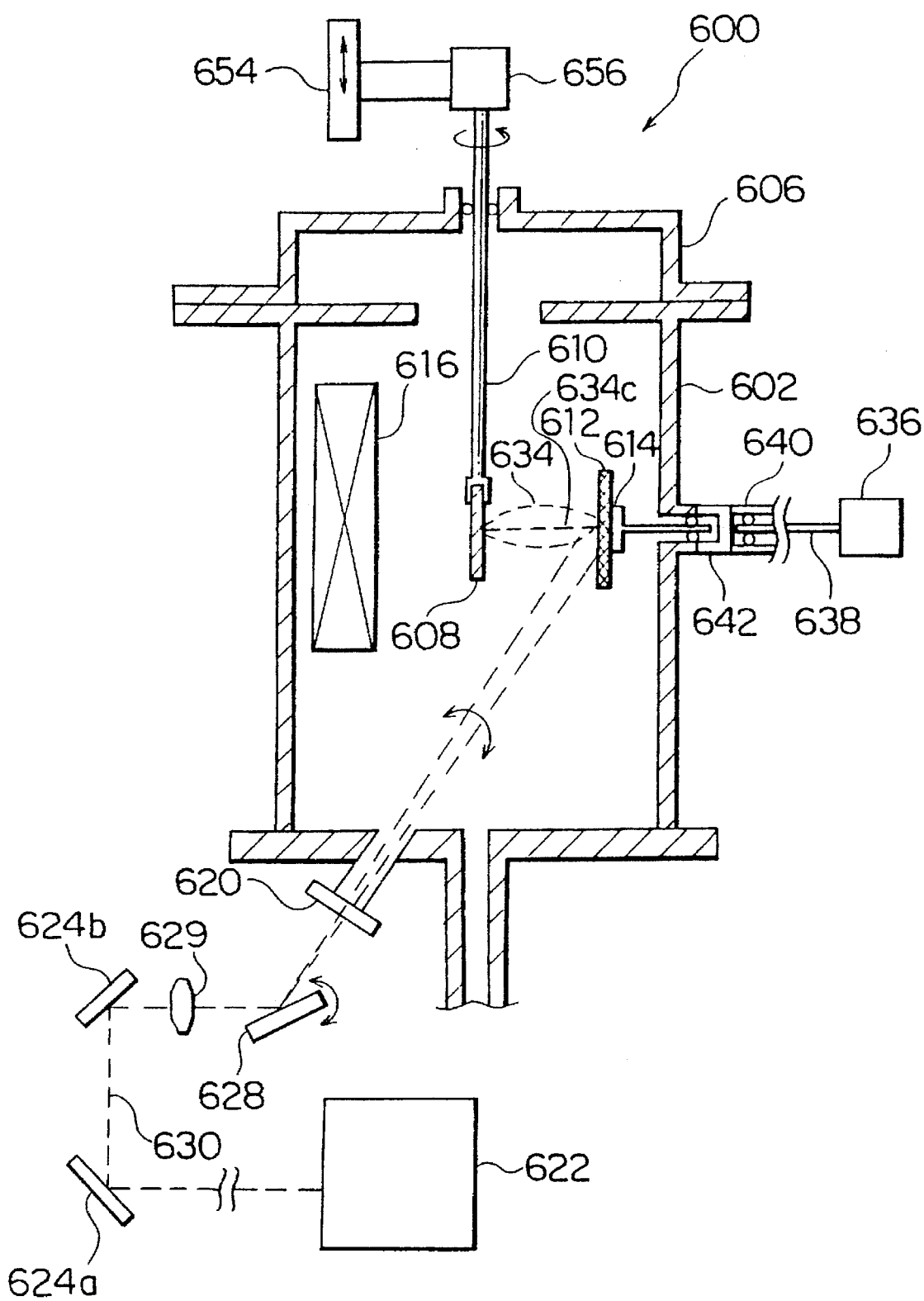
FIG. 6 is a cross-sectional view showing a third laser ablation apparatus which is preferably used for performing a manufacturing method in accordance with the present invention.

As shown in FIG. 6, a laser ablation apparatus 600 of the third embodiment according to the present invention comprises an evacuable processing chamber 602 having a cylindrical shape. The chamber 602 is externally defined by a body 604 made of stainless (SUS 304) and a lid 606 made of SUS 304. The chamber 602 contains a substrate holder 610 for holding a substrate 608 and a target holder 614 for holding a target 612 of a target material such as metal oxide.

As shown in FIG. 6, the cheer 602 includes a heater 616 within the chamber 602. The heater 602 can uniformly radiate to and heat the substrate 608 such that the uniform substrate temperature distribution is obtained. The chamber 602 is cooled with cooling water so as to prevent from overheating.

The heater 616 is capable of being controlled so as to adjust the output power to the desired level for the increasing substrate temperature during the deposition due to the change of the optical absorption index of the substrate.

Next, the laser optical system of the laser ablation apparatus 600 will be explained. In this apparatus 600, a laser beam source is positioned outside of the chamber. As shown in FIG. 6, the chamber 602 has an entrance window 620 through which a laser from the outside can pass and enter into the chamber 602. The laser beam optical system comprises a laser beam source 622, fixed mirrors 624a and 624b, a condenser lens 629, and a movable mirror 628 for the entrance window 620. The entrance window 620 is made of synthetic quartz having a thickness of 10 mm. The laser beam source 622 is equipped with a KrF excimer laser source for emitting a laser having a wavelength of 248 nm. Alternatively, this laser source may be of ArF excimer laser having a wavelength of 193 nm or of XeCl excimer laser having a wavelength of 308 nm.

The laser beam (indicated by dotted line 630) emitted from the laser beam source 622 strikes the mirror 628 to alter its path to the fixed mirrors 624a and 624b and the condenser lens 629. Atoms of target material of the target 612 are activated and sublimed upon the energy of the laser beam thereon so as to form a plume, which is schematically depicted with dotted curve 634, whereby the atoms constituting the target reach the substrate 608, thereby be deposited on the surface thereof. The plume 634 is formed with an axis 634c.

The arrangement of the substrate and the target in this embodiment is the on-axis oriented arrangement. More specifically, the substrate 608 is disposed to be substantially perpendicular to the axis 634c of the plume, or in other words, the surface of the substrate is positioned so as to form an angle of about 60° (deg.) to 120° (deg.) with respect to the axis 634c of the plume. Since a plume is formed with an axis perpendicular to the target surface, the deposition surface of substrate is disposed so as to have an angle of about −30° to about +30° with respect to the target surface.

In this embodiment, the rectangular mirror 628 defining the advancing direction of the laser is capable of moving such that the laser beam reflected by the mirror 628 can strike the entire target surface. In order to intermittently change the incident angle of the laser beam with respect to the target, the movable mirror 628 is connected to a motor (not shown) so as to allow periodic dual-axial swing movements. One of the dual-axis swing movements is performed around a first axis, which is an intersection line of the surface of the mirror 628 and the optical axis of the laser beam when the laser beam strikes in the center of the target. Another one of the dual-axis swing movements is performed around a second axis, which is perpendicular to the first axis and parallel to the surface of the mirror 628, and passes through the center of mirror 628. The laser beam reflected by the dual-axial movable mirror 628 enters the entrance window 620. Accordingly, the incident position on the target surface changes in two directions (vertical and horizontal directions).

Also, the target comprises a rotating mechanism by which, even when the mirror 628 is movable in only one axial direction, the laser can be made incident on the entire target surface.

As shown in FIG. 6, the mechanism for rotating the target within the laser ablation apparatus 600 comprises a motor 636, a shaft 638, a tube 640 for holding the shaft, and a coupling portion 642 are provided. An end portion of the shaft 638 on the chamber side and an end portion of the target holder 614 on the chamber wall side are respectively equipped with magnets (not shown), thereby the rotational movement of the shaft 638 provided by the motor 636 is transmitted to the target holder 614 by magnetic connection. The target 612 is rotated by means of such terminals for introducing magnetic coupling rotation.

As shown in FIG. 6, the substrate 608 is disposed at a position in parallel to the target 612. A motor 656 for turning the substrate surface inside out is provided at the upper portion of the cheer. The motor 656 is connected to the substrate holder 610 and reverses the substrate by 180° with a predetermined period. Consequently, the substrate 608 is capable of being intermittently reversed with a predetermined period so that both surfaces of the substrate 608 can sequentially contact the plume 634 during the substrate surface faces the target for the predetermined period. Thus, thin films can be deposited on both front and the back surfaces thereof in one deposition process. The motor 656 is programmable so as to freely adjust the reversing period. In this embodiment, the intermittent reversing of the substrate is made at intervals of about 17.5 seconds. While the reversing period is not particularly restricted as long as thin films can be uniformly formed on both sides of a substrate, it is preferable to reverse the substrate with a period during which a film is formed on the entire one of the two surfaces.

Also, in order to uniformly deposit the target material such as metal oxide complex on the substrate when the mirror 628 is capable of moving in only one axial direction, the laser ablation apparatus comprises a motor 654 for reciprocating the substrate along a predetermined axial direction in the vertical direction.

EXAMPLES

Example 1

(Manufacture of Microwave Resonator by Laser Ablation Apparatus Shown in FIGS. 3 and 4)

In Examples 1—1 to 1–6, members for a microwave resonator were manufactured while using various metal oxides as target materials and an single crystalline MgO plate as a substrate for depositing target materials. All the Examples 1-1 through 1-6 were carried out by using substantially same procedure and materials, except the metal oxides to be deposited.

Figure 1:
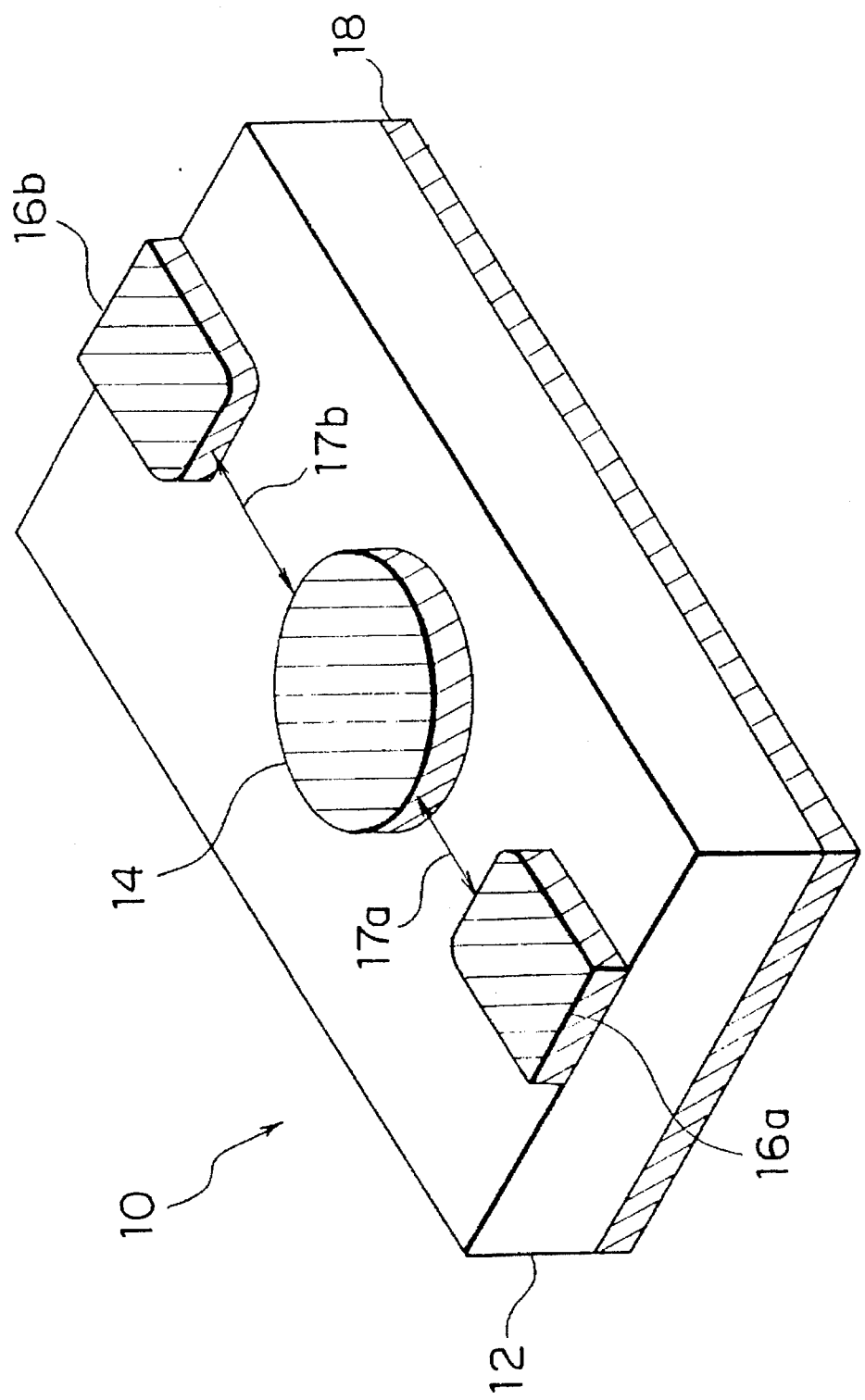
FIG. 1 is a perspective view schematically showing a microwave resonator manufactured in accordance with the present invention.

FIG. 1 is a perspective view showing a member for the microwave resonator manufactured in this example. Here, in order to facilitate representation, FIG. 1 is depicted with exaggeration and, accordingly, does not always correspond to the numerical values in the following explanation. As shown in FIG. 1, a microwave resonator member 10 comprises, on an MgO single crystal plate 12, a circular film 14 and substantially rectangular films 16a and 16b which are made of metal oxide complex, and also comprises, under the MgO 12, a ground plane film 18 which is similarly made of metal oxide. The MgO plate 12, which is a dielectric, has a dimension of: a length of 20 mm, a width of 10 mm, and a thickness of 0.5 mm. The circular film 14 has a dimension of: a diameter of 5 mm and a thickness of 0.5 μm. Each of the substantially rectangular films 16a and 16b has a dimension of: a length of 7 mm, a width of 1 mm, and a thickness of 0.5 μm, while being separated from the circular film 14 by a distance (indicated by arrow 17a or 17b) of 0.5 mm. The ground plane film 18 is formed on the whole lower surface of the MgO single crystal plate 12 with a uniform thickness of 0.5 μm.

Figure 2A:
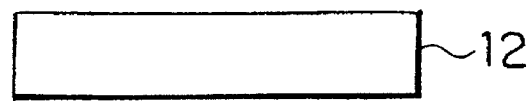
FIGS. 2A, 2B, 2C, 2D, 2E and 2F are cross-sectional views schematically Showing a microwave resonator formed in accordance with the present invention, respectively representing states thereof in successive steps of a manufacturing method in accordance with the present invention.
Figure 2B:
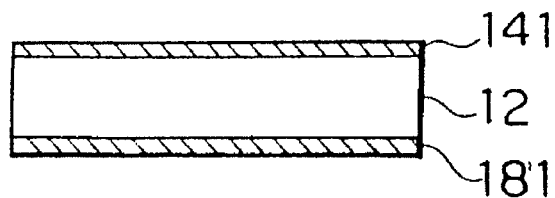
Figure 2C:
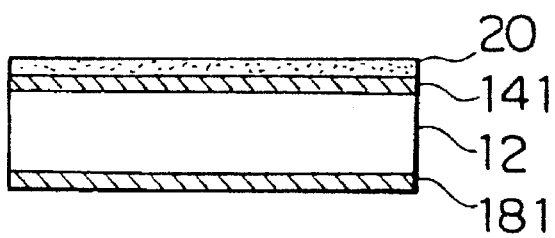
Figure 2D:
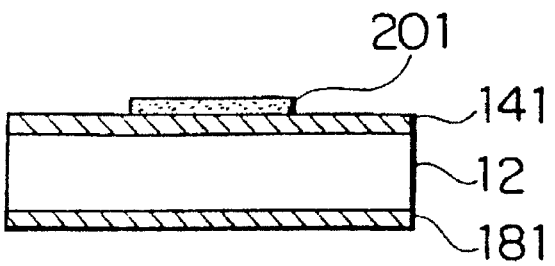
Figure 2E:
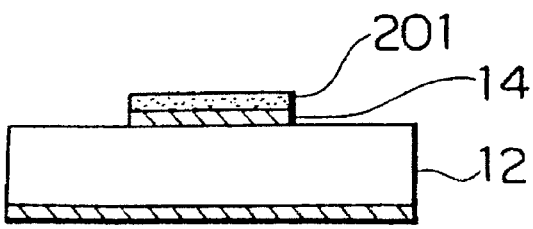
Figure 2F:
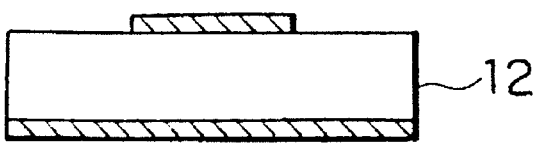

FIGS. 2A, 2B, 2C, 2D, 2E and 2F are cross-sectional views sequentially showing the steps for manufacturing the microwave resonator in this example. With reference to these drawings, the outline of the method for making the microwave resonator in this example will be explained. First, on the upper and lower surfaces of the dielectric 12 shown in FIG. 2A, oxides films 141 and 181 are simultaneously formed, respectively (FIG. 2B). Then, a photoresist is coated on the whole upper surface of the oxides film 141 so as to form a photoresist layer 20 (FIG. 2C). After being exposed to light by using a mask, the whole laminate is immersed in a developing liquid, whereby a photoresist pattern 201 is formed on the surface of the oxides film (FIG. 2D). Then, the oxides is removed by etching such that only a part of the oxides film that is protected by the pattern 201 is left (FIG. 2E; FIGS. 2E and 2F showing only the cross section of the circular film 14 shown in FIG. 1 without showing that of the rectangular films). Finally, the photoresist pattern 201 is removed so as to accomplish a desired microwave resonator.

Example 1-1

In Example 1-1, the laser ablation apparatus shown in FIGS. 3 and 4 was used to form thin films of a metal oxide on both front and the back surfaces of the MgO single crystal plate, i.e., dielectric, and then these layers were etched into predetermined patterns so as to manufacture a microwave resonator such as that shown in FIG. 1.

In Example 1-1, $Y_1Ba_2Cu_3O_{7-x}$ (hereinbelow referred "YBCO") was used as the metal oxide. As the dielectric substrate, an MgO single crystal plate which had (100) plane and whose both surfaces had been subjected to mirror polishing was used. The single crystal MgO substrate had a dimension of 40 mm×40 mm×0.5 mm. The targets were made of $Y_1Ba_2Cu_3O_{7-x}$.

(1: Forming of YBCO Thin Film on Both Sides of MgO Single Crystal Substrate (FIG. 2B))

Conditions for laser ablation were as follows. First, after the atmosphere within the chamber was reduced to $10^{-5}$ Torr, a flow of $O_2$ gas was supplied into the chamber such that the pressure within the chamber was adjusted to 400 mTorr. Then, electric power was applied to the heater and this condition was maintained to stabilize the substrate temperature at 650° to 700° C. In cases where a thermocouple has been placed near the substrate within the chamber beforehand to measure its temperature under various conditions of internal pressure and electric power, for example, thereby determining calibration curves concerning the electric power to the substrate temperature under the respective conditions, the temperature can be controlled, with a favorable reproducibility, solely based on manipulation of electric power. Then, the YBCO targets were rotated at 20 rpm, while the substrate was reciprocated. Electric power was supplied to the laser source (KrF laser having a wavelength of 248 nm) so as to make it generate a laser with a laser output of about 5 W. At this time, the frequency of the laser pulse was 5 Hz, while each pulse had a laser energy of 0.5 J/pulse.

Thus emitted laser strikes the total reflection mirror and then entered the prism, the surface of which had been coated with a non-reflective coating. The two lasers which had been split within the prism impinged on the targets disposed within the chamber respectively through the entrance windows whose surfaces had been coated with non-reflective coatings. In this example, each YBCO target was formed as a disk having a diameter of 20 mm, while the laser beam irradiation area on the target surface (or areas impinged by the laser beam) was 10 mm² (2 mm×5 mm). The laser energy density of the split single laser was 1.5 to 2.0 J/cm² after having been partially lost as the laser passed through the mirror and prism. Accordingly, the laser energy was 150 to 200 mJ.

In this example, the respective targets were placed in parallel to both surfaces of the substrate, while separate lasers were incident thereon. In this example, the angle at which the respective lasers (depicted with dotted lines 232a and 232b) were incident on the surfaces of the targets 212a and 212b was 45° (deg). Also, in order to prevent the targets from being locally consumed due to the fact that the laser impinged on a single point of the target surface, the targets were rotated while the laser was made incident on a position dislocated from the rotational axis. As a result, the laser was incident on a wide area on the target surface.

Also, the substrate was reciprocated in order to uniformly form the YBCO film on the whole surface thereof. As shown in FIG. 3, on the surfaces of the targets 212a and 212b irradiated with the lasers, YBCO constituting the target surface is sublimed so as to form plumes such as those depicted with dotted curves 234a and 234b. The plumes 234a and 234b are respectively formed with axes 234c and 234d. The amount of vapor deposition is the largest in the proximity of the axis or center of the plume and gradually decreases toward the outside therefrom. Accordingly, if the substrate is fixed, there will be a certain distribution in the thickness of the thin film deposited thereon. In order to prevent such a problem from occurring, the substrate was moved in horizontal and vertical directions in this example so as to form thin layers without thickness distribution. More specifically, the substrate in this example is arranged such that the axes 234c and 234d of the plumes are disposed so as to have an angle of about 60° (deg.) to about 120° (deg.) with respect to the substrate 208.

Figure 7:
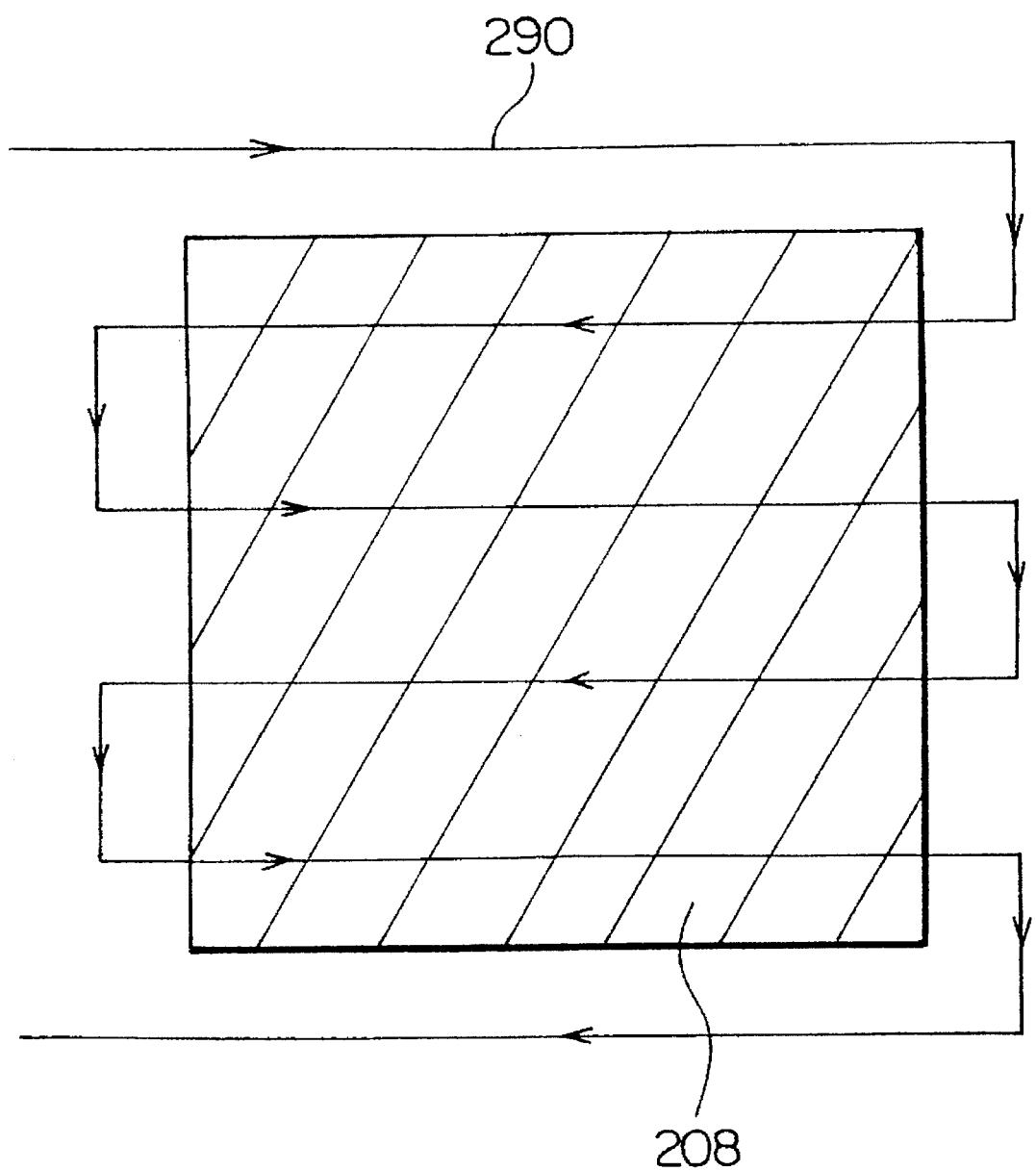
FIG. 7 is a plan view showing a surface of a substrate, schematically indicating a direction of movement of the substrate in an example.

FIG. 7 is a plan view of the substrate, schematically showing the movement of the substrate by indicating the positions where the plume axis impinges on the substrate surface. In FIG. 7, a comb-shaped arrow 290 schematically indicates the trace of the position of the center(axis) of the plume around the substrate 208. Here, since the incident position of the laser beam on the target surface is fixed, the center of the plume is also fixed relative to the target surface. Therefore, the two-dimensional movement of the substrate 208 should be performed so that the axis of the plume apparently moves with respect to the substrate 208 along the trace 290. For example, as in the case of the trace 290 of the plume center on the substrate surface shown in FIG. 7, the substrate moves in the horizontal direction by 5.0 cm with a velocity of 2 cm/sec and then in the vertically downward direction by 1.0 cm with a velocity of 2 cm/sec. Subsequently, it moves in the horizontally opposite direction by 5.0 cm with a velocity of 2 cm/sec and then in the vertically downward direction by 1.0 cm with a velocity of 2 cm/sec. These steps are repeated and then further repeated, with respect to the vertically upward direction. The position of the plume center on the surface of the substrate 208 was reciprocated along such trace as that depicted with the comb-like arrow 290, so that the thin film having a small thickness distribution could be formed on the entire surface of the substrate. The velocity of the movement can be optimized depending on various conditions such as distance between the target and the substrate, incident angle of the laser beam, and the laser beam energy. When relatively larger film thickness distribution can be tolerated, the substrate may be moved to achieve a smaller trace of the plume axis than the illustrated "5.0-cm square". Also, in order to obtain an optimal film quality, the each interval of each "tooth" of the "comb" trace may be optimized depending on operation conditions.

Further, without being restricted to the comb-like traces mentioned above, the substrate may be moved, for example, in a reciprocating manner simultaneously in the horizontal and vertical directions so as to attain a circular or ellipsoidal trace. As long as the thickness distribution of the formed film can be minimized, the mode of movement is not restricted in particular.

In order to realize such a movement of the substrate, linear motors are preferably used as the motors 254 and 256 which are disposed on the lid 206 of the cheer shown in FIG. 3 so as to move the substrate holder. Preferably, they are controlled by a programmable controller.

The two lasers 232a and 232b shown in FIG. 3 in this example are derived from the single laser 230 which is split by the prism 226. Accordingly, it is easy for these two lasers to have totally the same laser energy. Accordingly, energies formed by the respective lasers input to the targets can be easily made identical to each other. Namely, when both front and the back surfaces of the substrate are equally heated by a heater and the distances between the substrate and the respective targets are set equally, an oxide high-temperature superconductor can be easily formed on both front and the back surfaces of the substrate with the same film quality and the same deposition rate.

The laser beam energy activates Y, Ba, Cu, and O atoms of the target surface. Then the activated atoms are sublimed to be deposited on the substrate surface. In this manner, the depositing operation continued for about 17 minutes so as to deposit a thin layer of YBCO having a thickness of about 0.5 μm. In this example, the average deposition rate was about 1 angstrom/pulse.

The conductivity of the thin film formed on the MgO substrate in this manner was measured as explained in the following. One of the substrates on which the thin films had been formed was taken out for measuring the conductivity of the thin film and then a bridge of 20 μm×20 μm was formed on the thin film on one surface thereof by photolithography and etching. Then, under various temperature conditions, a general four point probe method was used to measure the voltage generated at both sides of the bridge, thereby yielding a resistance value. Thus, the temperature at which the generated voltage becomes not higher than 1 μV was defined as critical temperature for superconductivity (Tc). In the thin film of this embodiment, Tc was 90K. Then, at 77K, the current supplied to the bridge was gradually increased. The current at which a resistance was generated was defined as critical current (Ic). This Ic was divided by the current-passing cross-sectional area of the bridge to yield critical current density (Jc). The critical current density of the YBCO thin film manufactured in this example was 5,000,000 A/cm$^2$.

Also, a part of thus obtained YBCO thin film was removed and the resulting step formed at the boundary of the film and substrate was measured by a contact-type surface roughness tester. Similar measurement was performed on the whole surface of the film to determine the thickness distribution of the film. The fluctuation in thickness of the thin film formed in this example was within the range of +/−5% for each of the front and the back surfaces.

(2: Forming of Photoresist Pattern (FIGS. 2C and 2D))

On one surface of the YBCO film formed as mentioned above, a photoresist pattern was formed by a well-known photoresist.

As a photoresist material, without being restricted in particular, commercially available resist materials for silicon semiconductor can be used. For example, as a positive resist material, general positive resist materials such as OFPR-2 (manufactured by Tokyo Ohka Kogyo Co.) and AZ111 (manufactured by Hoechst AG) can be used. Also, as a negative resist material, JSR CIR-712 (manufactured by Japan Synthetic Rubber Co.) or the like can be used.

By a method widely used for the mass production step in the semiconductor manufacturing process, a positive photoresist material was coated and then exposed to light by using a mask, whereby the resist material having a pattern of the circular thin film 14 and substantially rectangular thin films 16a and 16b shown in FIG. 1 was formed on the YBCO thin film.

(3: Etching of YBCO (FIG. 2E))

The YBCO film was etched out leaving the portion protected by the photoresist formed as mentioned above. For the etching, ion milling widely used for the mass production step in the semiconductor manufacturing process was used.

(4: Removal of Resist Material (FIG. 2F))

Finally, the remaining resist material was removed by acetone, thereby accomplishing a microwave resonator member such as that shown in FIG. 1.

(5: Measurement of High-Frequency Characteristic of Microwave Resonator Member)

The high-frequency characteristic of thus formed microwave resonator member was evaluated. This microwave resonator member had a configuration in which an oxide high-temperature superconductor was formed on both front surface (where the circular thin film is formed) and the back surface of the dielectric. Accordingly, a microwave input into this resonator is guided in the horizontal direction, which is directed from one rectangular thin film to the other rectangular thin film through the circular thin film, while being resonated.

The high-frequency characteristic was evaluated as follows. Namely, after the resonator was equilibrated at a temperature of 77K within a cryostat, a microwave of 5 GHz was input thereto and the resulting Q value was determined. For measuring the Q value, a network analyzer was used.

Figure 8:
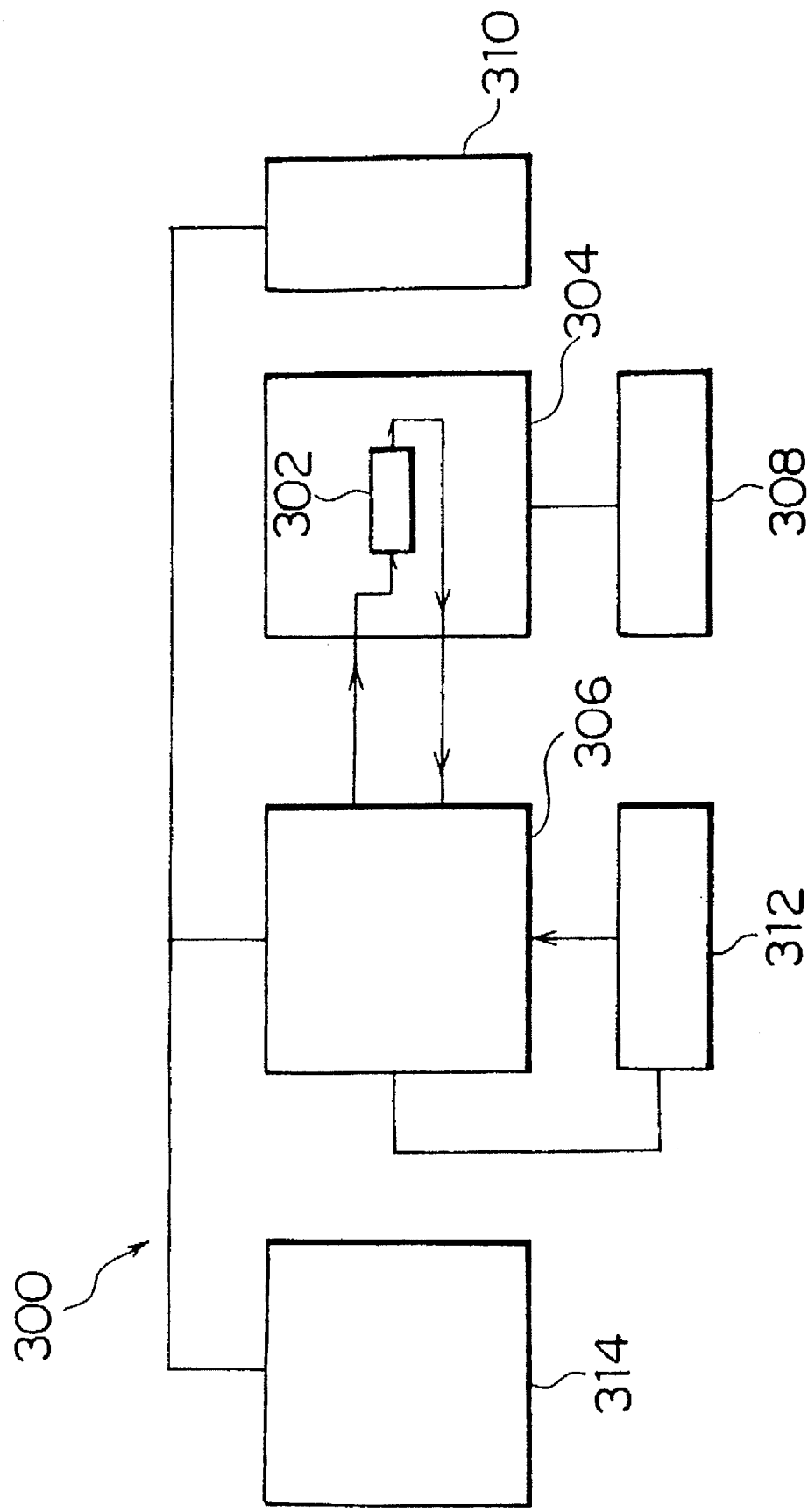
FIG. 8 is a system diagram showing an apparatus for measuring a high-frequency characteristic of a device.
Figure 9:
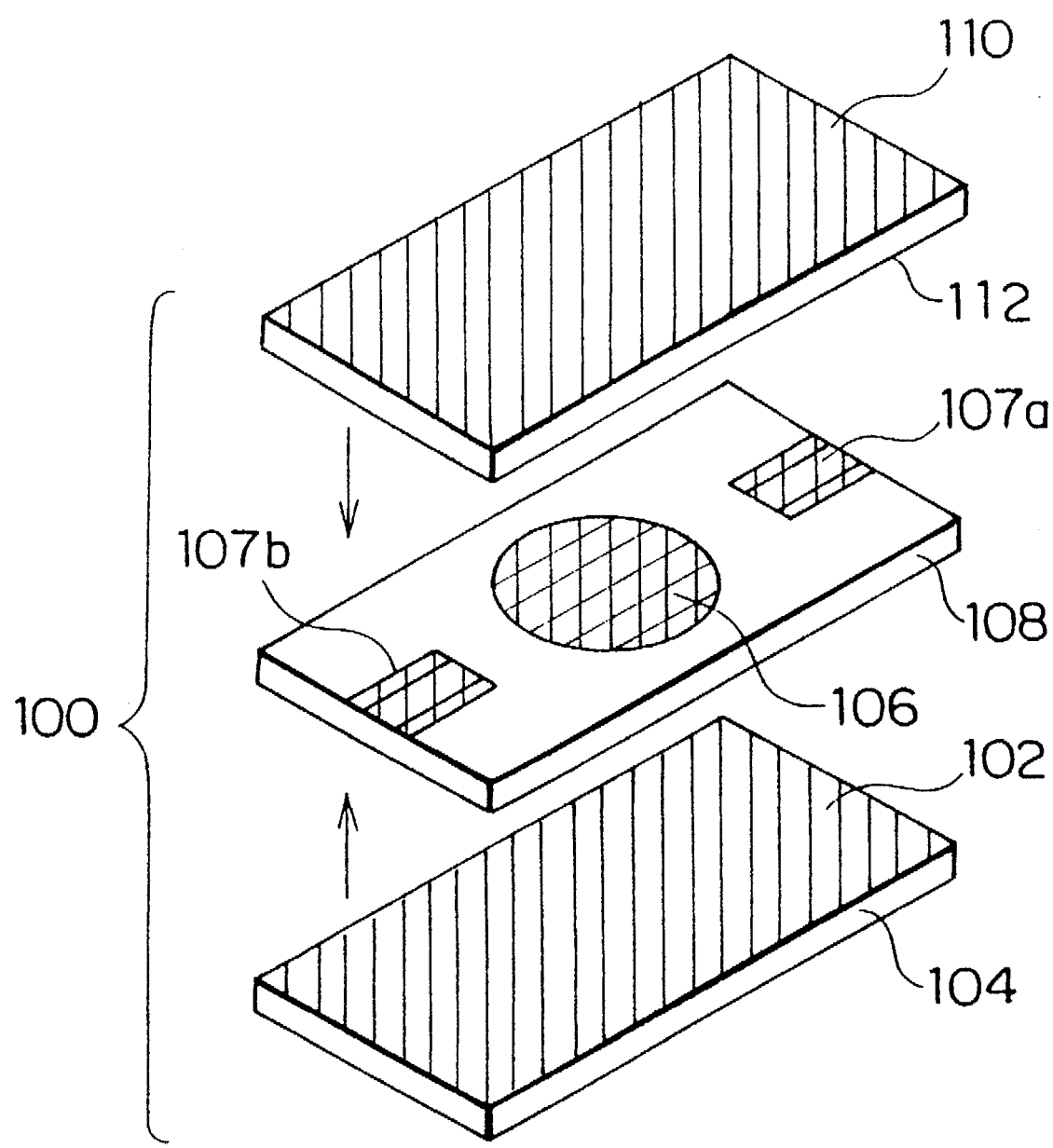
FIG. 9 is an exploded perspective view showing a microwave resonator in accordance with the prior art.

FIG. 8 is a system diagram of an apparatus used for evaluating the high-frequency characteristic of the microwave resonator manufactured in this example. As shown in FIG. 8, a high-frequency characteristic measuring apparatus 300 comprises a cryostat 304, which contains a sample (microwave resonator) 302 so as to equilibrate it at a predetermined temperature, and a network analyzer 306. The cryostat 304 is equipped with a cooler 308 and a temperature controller 310. The range of temperature which can be controlled by the temperature controller 310 is 30 to 300K. The network analyzer 306 is connected to a signal source 312 so as to control the latter. The network analyzer 306 and the temperature controller 310 are collectively controlled by a system controller 314. The network analyzer 306 used in this example was HP8515B (manufactured by Hewlett-Packard Co).

As shown in FIG. 8, the resonator 302 manufactured in this example was set within the cryostat 304 and cooled to a temperature of 77K. Then, a high-frequency signal of 5 GHz was generated at the signal source 312 and introduced into the network analyzer 306. This 5-GHz high-frequency signal was input into the sample 302 within the cryostat 304 by the network analyzer 306, while the response therefrom was fed back to the network analyzer 306.

The Q value of the microwave resonator manufactured in this example was 40,000 at 77K. Accordingly, it was confirmed that the microwave resonator using the oxide high-temperature superconductor manufactured in this example had a favorable frequency characteristic.

Example 1-2

In this example, $TlBa_2CaCu_2O_x$ was used as a deposition material for a target so as to deposit $TlBa_2CaCu_2O_x$ on an MgO substrate.

First, the apparatus shown in FIG. 3 was used to form thin films of $TlBa_2CaCu_2O_x$ by the method totally the same as that of Example 1-1. Then, in view of the fact that the vapor pressure of Tl was so high that Tl was likely to disappear from within the thin films, after the formation of the thin films, the substrate was subjected to a heat treatment at 800° C. for 10 hours in an atmosphere of $O_2+Tl$. After the heat treatment, the high-frequency characteristic of the thin film was evaluated in the same manner as Example 1-1. The photolithography to etching steps were performed in the same manner as those of Example 1-1 so as to manufacture a microwave resonator having the same configuration as that of Example 1-1. Then, in the same manner as Example 1-1, the Q value was evaluated.

Thus obtained $TlBa_2CaCu_2O_x$ thin film exhibited a Tc of 95K and a Jc of 1,000,000 A/cm$^2$ at 77K. Also, the Q value of thus manufactured resonator was 42,000.

Example 1-3

In this example, $Tl_2Ba_2CaCu_2O_x$ was used as a deposition material for a target so as to deposit $Tl_2Ba_2CaCu_2O_x$ on an MgO substrate.

First, the apparatus shown in FIG. 3 was used to form thin films of $Tl_2Ba_2CaCu_2O_x$ by a method which is the same as that of Example 1-1 except that the substrate temperature was set within the range of 300° to 350° C. Then, in view of the fact that the vapor pressure of Tl was so high that Tl was likely to disappear from within the thin films, after the formation of the thin films, the substrate was subjected to a heat treatment at 900° C. for 10 hours in an atmosphere of $O_2+Tl$. After the heat treatment, the high-frequency characteristic of the thin film was evaluated in the same manner as Example 1-1. The photolithography to etching steps were performed in the same manner as those of Example 1-1 so as to manufacture a microwave resonator having the same configuration as that of Example 1-1. Then, in the same manner as Example 1-1, the Q value was evaluated.

Thus obtained $Tl_2Ba_2CaCu_2O_x$ thin film exhibited a Tc of 100K and a Jc of 1,200,000 A/cm$^2$ at 77K. Also, the Q value of thus manufactured resonator was 50,000.

Example 1-4

In this example, $Tl_2Ba_2Ca_2Cu_3O_x$ was used as a deposition material for a target so as to deposit $Tl_2Ba_2Ca_2Cu_3O_x$ on an MgO substrate.

First, the apparatus shown in FIG. 3 was used to form thin films of $Tl_2Ba_2Ca_2Cu_3O_x$ by a method which is the same as that of Example 1-1 except that the substrate temperature was set within the range of 300° to 350° C. Then, in view of the fact that the vapor pressure of Tl was so high that Tl was likely to disappear from within the thin films, after the formation of the thin films, the substrate was subjected to a heat treatment at 850° C. for 12 hours in an atmosphere of $O_2+Tl$. After the heat treatment, the high-frequency characteristic of the thin film was evaluated in the same manner as Example 1-1. The photolithography to etching steps were performed in the same manner as those of Example 1-1 so as to manufacture a microwave resonator having the same configuration as that of Example 1-1. Then, in the same manner as Example 1-1, the Q value was evaluated.

Thus obtained $Tl_2Ba_2Ca_2Cu_3O_x$ thin film exhibited a Tc of 115K and a Jc of 3,000,000 A/cm$^2$ at 77K. Also, the Q value of thus manufactured resonator was 55,000.

Example 1-5

In this example, $Bi_2Sr_2CaCu_2O_x$ was used as a deposition material for a target so as to deposit $Bi_2Sr_2CaCu_2O_x$ on an MgO substrate.

First, the apparatus shown in FIG. 3 was used to form thin films of $Bi_2Sr_2CaCu_2O_x$ by a method which is the same as that of Example 1-1 except that the substrate temperature was set within the range of 700° to 750° C. Then, the high-frequency characteristic of the thin film was evaluated in the same manner as Example 1-1. The photolithography to etching steps were performed in the same manner as those of Example 1-1 so as to manufacture a microwave resonator having the same configuration as that of Example 1-1. Then, in the same manner as Example 1-1, the Q value was evaluated.

Thus obtained $Bi_2Sr_2CaCu_2O_x$ thin film exhibited a Tc of 85K and a Jc of 800,000 A/cm$^2$ at 77K. Also, the Q value of thus manufactured resonator was 35,000.

Example 1-6

In this example, $Bi_2Sr_2Ca_2Cu_3O_x$ was used as a deposition material for a target so as to deposit $Bi_2Sr_2Ca_2Cu_3O_x$ on an MgO substrate.

First, the apparatus shown in FIG. 3 was used to form thin films of $Bi_2Sr_2Ca_2Cu_3O_x$ by a method which is the same as that of Example 1-1 except that the substrate temperature was set within the range of 625° to 675° C. Then, the high-frequency characteristic of the thin film was evaluated in the same manner as Example 1-1. The photolithography to etching steps were performed in the same manner as those of Example 1-1 so as to manufacture a microwave resonator having the same configuration as that of Example 1-1. Then, in the same manner as Example 1-1, the Q value was evaluated.

Thus obtained $Bi_2Sr_2Ca_2Cu_3O_x$ thin film exhibited a Tc of 90K and a Jc of 900,000 A/cm$^2$ at 77K. Also, the Q value of thus manufactured resonator was 40,000.

Example 2

(Manufacture of Microwave Resonator by Second Laser ablation Apparatus in Accordance with Present Invention Shown in FIG. 5)

In Examples 2-1 to 2-6, while using various metal oxides as target materials and an MgO single crystal plate as a substrate for members, films of the metal oxides were formed on the MgO single crystal plate in the laser ablation apparatus shown in FIG. 5. Then, in the steps similar to those of Example 1, members for a microwave resonator such as that shown in FIG. 1 were manufactured. Examples 2-1 to 2-6 were identical to each other except for their kinds of metal oxides to be deposited.

Example 2-1

In Example 2-1, $YBa_2Cu_3O_{7-x}$ was used as the metal oxide. As the dielectric substrate, an MgO single crystal plate which had (100) plane and whose both surfaces had been subjected to mirror polishing was used. This MgO single crystal substrate had a size of 40 mm×40 mm×0.5 mm.

In the apparatus shown in FIG. 5, each target was formed as a rectangular shape having a length of 30 mm and a width of 7 mm, while the laser irradiation area on the target surface was 10 mm$^2$ (irradiation area of 2 mm×5 mm). The laser energy density of the split single laser was 1.5 to 2.0 J/cm$^2$ after having been partially lost as the laser passed through the mirror and prism. Accordingly, the laser energy was 150 to 200 mJ.

In this example, the respective targets were placed in parallel to both surfaces of the substrate, while separate lasers were incident thereon. In this example, the angle at which the respective lasers (depicted with dotted lines 532a and 532b) were incident on the surfaces of the targets 512a and 512b was 45° (deg). Also, in order to prevent the targets from being locally consumed due to the fact that the laser impinged on a single point of the target surface, the targets were vertically reciprocated. As a result, the laser was incident on a wide area on the target surface.

In order to uniformly deposit the material on the whole surface of the substrate, as in the case of the first apparatus, the substrate was moved along a trace such as that shown in FIG. 7. The two-dimensional movement of the substrate 508 should be performed so that the axis of the plume apparently moves with respect to the substrate along the trace 290.

The position of the plume center on the surface of the substrate 508 was reciprocated along such trace as that depicted with the comb-shaped arrow 290, so that the thin film having a small thickness distribution could be formed on the entire surface of the substrate. At the target surface on which the laser beams impinges, each atom of Y, Ba, Cu, and O is sublimed and, reaches the substrate so as to be deposited thereon. In this manner, the depositing operation continued for about 17 minutes so as to deposit a thin layer of YBCO having a thickness of about 0.5 µm. In this example, the average deposition rate was about 1 angstrom/pulse.

The conductivity of the thin film formed on the MgO substrate was measured in the same manner as in the case where the first apparatus according to the present invention was used.

Then, a photoresist pattern was formed, YBCO was etched, and then the remaining resist material was removed so as to accomplish the microwave resonator member as in the case of the thin film formed by using the first apparatus shown in FIG. 1.

In a method similar to that in the case where the first apparatus was used, the high-frequency characteristic of thus manufactured microwave resonator member was evaluated. The Q value of this microwave resonator was 35,000 at 77K. Accordingly, it was confirmed that the microwave resonator using the oxide high-temperature superconductor manufactured in this example had a favorable frequency characteristic.

Example 2-2

In a manner similar to Example 2-1, $TlBa_2CaCu_2O_x$ was used as a deposition material for a target so as to deposit $TlBa_2CaCu_2O_x$ on an MgO substrate, thereby forming a microwave resonator, whose high-frequency characteristic was then evaluated.

Thus obtained $TlBa_2CaCu_2O_x$ thin film exhibited a Tc of 95K and a Jc of 1,000,000 A/cm$^2$ at 77K. Also, the Q value of thus manufactured resonator was 42,000.

Example 2-3

$Tl_2Ba_2CaCu_2O_x$ was used as a deposition material for a target so as to deposit $Tl_2Ba_2CaCu_2O_x$ on an substrate, thereby forming a microwave resonator, whose high-frequency characteristic was then evaluated.

Thus obtained $Tl_2Ba_2CaCu_2O_x$ thin film exhibited a Tc of 100K and a Jc of 1,200,000 A/cm$^2$ at 77K. Also, the Q value of thus manufactured resonator was 50,000.

Example 2-4

$Tl_2Ba_2Ca_2Cu_3O_x$ was used as a deposition material for a target so as to deposit $Tl_2Ba_2Ca_2Cu_3O_x$ on an substrate, thereby forming a microwave resonator, whose high-frequency characteristic was then evaluated.

Thus obtained $Tl_2Ba_2Ca_2Cu_3O_x$ thin film exhibited a Tc of 115K and a Jc of 3,000,000 A/cm$^2$ at 77K. Also, the Q value of thus manufactured resonator was 55,000.

Example 2-5

$Bi_2Sr_2CaCu_2O_x$ was used as a deposition material for a target so as to deposit $Bi_2Sr_2CaCu_2O_x$ on an MgO substrate, thereby forming a microwave resonator, whose high-frequency characteristic was then evaluated.

Thus obtained $Bi_2Sr_2CaCu_2O_x$ thin film exhibited a Tc of 85K and a Jc of 800,000 A/cm$^2$ at 77K. Also, the Q value of thus manufactured resonator was 35,000.

Example 2-6

$Bi_2Sr_2Ca_2Cu_3O_x$ was used as a deposition material for a target so as to deposit $Bi_2Sr_2Ca_2Cu_3O_x$ on an MgO substrate, thereby forming a microwave resonator, whose high-frequency characteristic was then evaluated.

Thus obtained $Bi_2Sr_2Ca_2Cu_3O_x$ thin film exhibited a Tc of 90K and a Jc of 900,000 A/cm$^2$ at 77K. Also, the Q value of thus manufactured resonator was 40,000.

Example 3

(Manufacture of Microwave Resonator by Third Laser ablation Apparatus in Accordance with Present Invention Shown in FIG. 6)

In Examples 3-1 to 3-6, while using various metal oxides as target materials and an MgO single crystal plate as a substrate for members, films of the metal oxides were formed on the MgO single crystal plate in the laser ablation apparatus shown in FIG. 6. Then, in the steps similar to those of Example 1, members for a microwave resonator such as that shown in FIG. 1 were manufactured. Examples 3-1 to 3-6 were identical to each other except for their kinds of metal oxides to be deposited.

Example 3-1

In Example 3-1, $YBa_2Cu_3O_{7-x}$ was used as the metal oxide. As the dielectric substrate, an MgO single crystal plate which had (100) plane and whose both surfaces had been subjected to mirror polishing was used. This MgO single crystal substrate had a size of 40 mm×40 mm×0.5 mm.

Conditions for laser ablation in this example were as follows. First, after the atmosphere within the chamber was reduced to $10^{-5}$ Torr, a flow of $O_2$ gas was supplied into the chamber such that the pressure within the chamber was maintained at 400 mTorr. Then, electric power was supplied to the heater and this condition was maintained until the substrate temperature was stabilized at 650° to 700° C. In cases where a thermocouple has been placed near the substrate within the chamber beforehand to measure its temperature under various conditions of internal pressure and electric power, for example, thereby determining calibration curves concerning the electric power to the substrate temperature under the respective conditions, the temperature can be controlled, with a favorable reproducibility, solely based on manipulation of electric power. Then, the target was rotated at 20 rpm, while the substrate was moved. Electric power was supplied to the laser source (KrF laser having a wavelength of 248 nm) so as to make it generate a laser with a laser output of about 5 W. At this time, the frequency of the laser pulse was 5 Hz, while each pulse had a laser energy of 0.25 J/pulse.

Thus emitted laser impinged on the total reflection mirror and then, by way of the entrance window whose surface had been coated a non-reflective coating, on the target disposed within the chamber. In this example, the target was formed as a rectangular parallelopiped having sides of 60 mm and a thickness of 5 mm, while the laser irradiation area on the target surface was 10 mm² (irradiation area of 2 mm×5 mm). The laser energy density of the laser was 1.5 to 2.0 J/cm². Accordingly, the laser energy was 150 to 200 mJ.

In order to uniformly deposit the material across the entire surface of the substrate, the plume axis moved along a trace such as that shown in FIG. 7. In the third embodiment of the present invention, the two-dimensional movement of the plume axis was performed by two-dimensionally altering the direction of the laser beam to the target, as shown in FIG. 6. The two-dimensional altering of the laser beam is effected by two-dimensional swing movement of the mirror 628 around the two axes as mentioned before. Thus, the position of the plume axis on the surface of the substrate 608 was reciprocated along such trace as that depicted with the comb-shaped arrow 290, as shown in FIG. 7, so that the thin film having a small thickness distribution could be formed on the entire surface of the substrate. The sufficient swinging angle of each swing movement of the mirror 628 was within +/−3° (deg.) for scanning along the entire comb-shaped arrow 290 of 5 cm square shown in FIG. 7, when the distance between the mirror 628 and the target 612 was about 50 cm.

In the mathematical sense, the trace of the altering laser beam on the target is exactly a part of an arc. However, the trace can be regarded as a straight line, because very small swinging angle (+/−3°) is sufficient for scanning the entire range.

Alternatively, since the substrate can be vertically moved in this apparatus, the laser beam may be scanned only in a single horizontal direction by 50 mm at a velocity of 2 cm/sec, while the substrate is vertically moved by 10 mm at a velocity of 2 cm/sec, in synchronization with the arrival of the laser beam at the end of the scan. The synchronistical moves of the laser beam and the substrate can achieve the similar two-dimensional scanning shown in FIG. 7. At this time, the target was rotated at 20 rpm in order to uniformly consume the target material across the entire surface.

As long as the thickness distribution of the formed film can be minimized, there is no particular restriction as to how the movable mirror was moved.

Also, the substrate 608 was reversed by 180° at intervals of about 17.5 seconds, during which one surface was completely scanned, in order to form thin films on both front and the back surfaces thereof.

In order to realize such a movement of the substrate, linear motors are preferably used as the motors 654 and 656 which are disposed on the lid 606 of the chamber shown in FIG. 6 so as to move the substrate holder. Preferably, they are controlled by a programmable controller.

At the target surface on which the laser beam impinge, each atom of Y, Ba, Cu, and O is sublimed and, as an atom, reaches the substrate so as to be deposited thereon. In this manner, the depositing operation was performed about 34 minutes so as to deposit a thin layer of YBC0 having a thickness of about 0.5 μm. In this example, based on the thickness of thus obtained YBCO film and the operation time, the average deposition rate was about 1 angstrom/pulse.

The conductivity of the thin film thus formed on the MgO substrate was measured in the same manner as in the case where the first apparatus was used.

Then, as in the case of the thin film formed by using the first apparatus, a photoresist pattern was formed, YBCO was etched, and then the remaining resist material was removed to accomplish the microwave resonator member such as that shown in FIG. 1.

In a method similar to that in the case where the first apparatus was used, the high-frequency characteristic of thus manufactured microwave resonator member was evaluated. The Q value of this microwave resonator was 35,000 at 77K. Accordingly, it was confirmed that the microwave resonator using the oxide high-temperature superconductor manufactured in this example had a favorable frequency characteristic.

Example 3-2

In a manner similar to Example 3-1, $TlBa_2CaCu_2O_x$ was used as a deposition material for a target so as to deposit $TlBa_2CaCu_2O_x$ on an MgO substrate, thereby forming a microwave resonator, whose high-frequency characteristic was then evaluated.

Thus obtained $TlBa_2CaCu_2O_x$ thin film exhibited a Tc of 95K and a Jc of 1,000,000 A/cm² at 77K. Also, the Q value of thus manufactured resonator was 42,000.

Example 3-3

$Tl_2Ba_2CaCu_2O_x$ was used as a deposition material for a target so as to deposit $Tl_2Ba_2CaCu_2O_x$ on an MgO substrate, thereby forming a microwave resonator, whose high-frequency characteristic was then evaluated.

Thus obtained $Tl_2Ba_2CaCu_2O_x$ thin film exhibited a Tc of 100K and a Jc of 1,200,000 A/cm² at 77K. Also, the Q value of thus manufactured resonator was 50,000.

Example 3-4

$Tl_2Ba_2Ca_2Cu_3O_x$ was used as a deposition material for a target so as to deposit $Tl_2Ba_2Ca_2Cu_3O_x$ on an MgO substrate, thereby forming a microwave resonator, whose high-frequency characteristic was then evaluated.

Thus obtained $Tl_2Ba_2Ca_2Cu_3O_x$ thin film exhibited a Tc of 115K and a Jc of 3,000,000 A/cm² at 77K. Also, the Q value of thus manufactured resonator was 55,000.

Example 3-5

$Bi_2Sr_2CaCu_2O_x$ was used as a deposition material for a target so as to deposit $Bi_2Sr_2CaCu_2O_x$ on an MgO substrate, thereby forming a microwave resonator, whose high-frequency characteristic was then evaluated.

Thus obtained $Bi_2Sr_2CaCu_2O_x$ thin film exhibited a Tc of 85K and a Jc of 800,000 A/cm² at 77K. Also, the Q value of thus manufactured resonator was 35,000.

Example 3-6

$Bi_2Sr_2Ca_2Cu_3O_x$ was used as a deposition material for a target so as to deposit $Bi_2Sr_2Ca_2Cu_3O_x$ on an MgO substrate, thereby forming a microwave resonator, whose high-frequency characteristic was then evaluated.

Thus obtained $Bi_2Sr_2Ca_2Cu_3O_x$ thin film exhibited a Tc of 90K and a Jc of 900,000 A/cm² at 77K. Also, the Q value of thus manufactured resonator was 40,000.

It should be understood that the preferred embodiments of the invention are given by way of illustration only. From the invention thus described, it will be obvious that the invention may be varied in many ways. For example, as the dielectric substrate, other than MgO, such materials as LaAlO$_3$ having (100) plane, sapphire having R plane (Al$_2$O$_3$), and SrTiO$_3$ may be used. Such variations are not to be regarded as a departure from the spirit and scope of the invention, and all such modifications as would be obvious to one skilled in the art are intended for inclusion within the scope of the following claims.

The basic Japanese Application Nos. 074424/1995 (7-074424) filed on Mar. 7, 1995, 074445/1995 (7-074445) filed on Mar. 7, 1995, and 074608/1995 (7-074608) filed on Mar. 7, 1995 are hereby incorporated by reference.

What is claimed is:

1. An apparatus for depositing thin films on a substrate having a first surface and a second surface, said apparatus comprising:
    (1) a vacuum cheer, which is thermally resistant at a temperature of about 200° C., said vacuum chamber including:
        (a) a first target of a first deposition material supported by a first target holder;
        (b) a second target of a second deposition material supported by a second target holder so as to face said first target;
        (c) a substrate holder for holding said substrate such that said first and second surfaces of said substrate face said first and second targets, respectively;
        (d) a heating means for heating said first and second surfaces of said substrate;
        (e) a first entrance window through which a first laser beam passes to impinge onto said first target with a predetermined angle; and
        (f) a second entrance window through which a second laser beam passes to impinge onto said second target with a predetermined angle, and
    (2) a laser beam optical system comprising at least one laser beam source and an optical path system from said laser beam source to said targets, said optical path system including mirrors for reflecting the laser beams toward said targets through said entrance windows of said chamber.

2. An apparatus according to claim 1, further comprising a means for moving substrate, said means being connected to said substrate holder and intermittently moving said substrate with a predetermined periodicity.

3. An apparatus according to claim 1, wherein said laser beam source is a single laser beam source, wherein said optical path system has a prism which splits an incident single laser beam from said laser beam source into said first and second laser beams.

4. An apparatus according to claim 1, further comprising a first means for moving target and a second means for moving target, said first means for moving target being connected to said first target holder and intermittently moving said first target with a predetermined periodicity, said second means for moving target being connected to said second target holder and intermittently moving said second target with a predetermined periodicity.

5. An apparatus according to claim 4, wherein both said first means and second means rotate, and wherein said mirror of said optical path system is disposed such that said first and second laser beams enter onto said first and second targets, respectively, so as to strike the points of the target surfaces other than the center axes of said rotational movements of said first and second targets.

6. An apparatus according to claim 1, wherein said first deposition material is substantially the same as said second deposition material.

7. A method for depositing thin films onto a first and a second surfaces of a substrate, said method comprising the steps of:
    (a) disposing a first target of a first deposition material for depositing film onto said first surface and a second target of a second deposition material for depositing film onto said second surface, said first target facing said second target within said chamber;
    (b) disposing a substrate between said first target and said second target such that said first and second surfaces of said substrate face said first and second targets, respectively;
    (c) heating said substrate with a heating means disposed within said chamber; and
    (d) directing a first laser beam to said first target and a second laser beam to said second target, to form a first plume over said first target and a second plume over said second target, the axis of said first plume being substantially perpendicular to said first surface of said substrate and the axis of said second plume being substantially perpendicular to said second surface of said substrate, wherein said first plume contacts said first surface of said substrate and said second plume contacts said second surface of said substrate, thereby depositing said first deposition material on said first surface and depositing said second deposition material on said second surface.

8. A method according to claim 7, wherein, in said step (d) for directing laser beams, (i) both said first and second targets are rotated and (ii) said first laser beam impinges onto a position of said first target surface other than the center of the rotational axis of said first target while said second laser beam impinges onto a position of said second target surface other than the center of the rotational axis of said second target.

9. An apparatus for depositing thin films on a substrate having a first surface and a second surface, said apparatus comprising:
    (1) a vacuum chamber, which is thermally resistant at a temperature of about 1,000° C., said vacuum chamber including:
        (a) a first target of a first deposition material supported by a first target holder;
        (b) a second target of a second deposition material supported by a second target holder so as to face said first target;
        (c) a substrate holder for holding a substrate such that said first and second surfaces of said substrate respectively face said first and second targets;
        (d) a chamber wall having a substantially transparent portion;
        (e) a first entrance window through which a first laser beam passes to impinge onto said first target with a predetermined angle; and
        (f) a second entrance window through which a second laser beam passes to impinge onto said second target with a predetermined angle,
    (2) a heating means disposed outside the chamber for radiating to and heating said first and second surfaces of said substrate through said substantially transparent portion of said chamber wall, and
    (3) a laser beam optical system comprising at least one laser beam source and an optical path system from said laser beam source to said targets, said optical path system including mirrors for reflecting the laser beams toward said targets through said entrance windows of said chamber.

10. An apparatus according to claim 9, further comprising a means for moving substrate, said means being connected to said substrate holder and intermittently moving said substrate with a predetermined periodicity.

11. An apparatus according to claim 10, further comprising a means for moving said first target and a means for moving said second target, said means for moving said first target being connected to said first target holder and intermittently moving said first target with a predetermined periodicity, and said means for moving said second target being connected to said second target holder and intermittently moving said second target with a predetermined periodicity.

12. An apparatus according to claim 9, wherein said laser beam source is a single laser beam source, wherein said optical path system has a prism which splits an incident single laser beam from said laser beam source into said first and second laser beams.

13. An apparatus according to claim 9, said chamber wall is made of quartz.

14. An apparatus according to claim 9, wherein said first deposition material is substantially the same as said second deposition material.

15. A method for depositing thin films onto a first and a second surfaces of a substrate, said method comprising the steps of:

(a) disposing a first target of a first deposition material for depositing film onto said first surface and a second target of a second deposition material for depositing film onto said second surface, said first target facing said second target within said chamber;

(b) disposing a substrate between said first target and said second target such that said first and second surfaces of said substrate face said first and second targets, respectively;

(c) heating said substrate with a heating means disposed outside said cheer; and (d) directing a first laser beam to said first target and a second laser beam to said second target, to form a first plume over said first target and a second plume over said second target, the axis of said first plume being substantially perpendicular to said first surface of said substrate and the axis of said second plume being substantially perpendicular to said second surface of said substrate, wherein said first plume contacts said first surface of said substrate and said second plume contacts said second surface of said substrate, thereby depositing said first deposition material on said first surface and depositing said second deposition material on said second surface.

16. A method according to claim 15, wherein said first and second target respectively make intermittent movements with a predetermined periodicity, in said step (d) for directing laser beams.

17. An apparatus for depositing thin films on a substrate having a first surface and a second surface, said apparatus comprising:

(1) a vacuum chamber, which is thermally resistant at a temperature of about 200° C., said vacuum chamber including:
   (a) a target of a deposition material supported by a target holder;
   (b) a substrate holder for holding a substrate such that either of said surfaces of said substrate faces said target;
   (c) a reversing means for intermittently reversing the substrate with a predetermined period;
   (d) a heating means for heating the substrate; and
   (e) an entrance window through which a laser beam passes to impinge onto said target with a predetermined angle, and (2) a laser beam optical system comprising a laser beam source and an optical path system from said laser beam source to said target, said optical path system including at least one mirror for reflecting the laser beam toward said target through said entrance window of said chamber.

18. An apparatus according to claim 17, further comprising a means for moving substrate, said means being connected to said substrate holder and intermittently moving said substrate with a predetermined periodicity.

19. An apparatus according to claim 17, wherein said mirror is capable of moving so that the laser beam impinges onto said target with varying incident angle, said varying incident angle intermittently varying with predetermined periodicity depending on the intermittent movement of said mirror.

20. An apparatus according to claim 17, further comprising a means for moving said target, said means for moving said target being connected to said target holder and intermittently moving said target with a predetermined periodicity.

21. An apparatus according to claim 20, wherein said means for moving said target is capable of rotating said target.

22. A method for depositing thin films onto a first and a second surfaces of a substrate, said method comprising the steps of:

(a) disposing a target of a deposition material for depositing film onto said surfaces within said chamber;

(b) disposing a substrate near said target such that either of said surfaces of said substrate faces said target;

(c) heating said substrate with a heating means; and (d) directing a laser beam to said target to form a plume over said target, the axis of said plume being substantially perpendicular to said surfaces of said substrate, while reversing the substrate with a predetermined period, thereby depositing the target material on both of the first and second surfaces of the substrate.

23. A method according to claim 22, wherein, in said step (d) for directing laser beams, (i) said target rotates and (ii) said laser beam impinges onto a position of said target surface other than the center of the rotational axis of said first target.

* * * * *